United States Patent
Yang et al.

(10) Patent No.: US 10,332,851 B2
(45) Date of Patent: Jun. 25, 2019

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Chung-Chieh Yang, Kaohsiung (TW); Sheng-Ming Wang, Kaohsiung (TW); Tien-Szu Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/630,843

(22) Filed: Jun. 22, 2017

(65) Prior Publication Data

US 2018/0374811 A1    Dec. 27, 2018

(51) Int. Cl.
*H01L 23/00* (2006.01)

(52) U.S. Cl.
CPC .... *H01L 24/09* (2013.01); *H01L 2924/30101* (2013.01)

(58) Field of Classification Search
CPC .................. H01L 24/09; H01L 2924/30101
See application file for complete search history.

(56) References Cited

U.S. PATENT DOCUMENTS

| | | | |
|---|---|---|---|
| 7,196,415 B2* | 3/2007 | Zhong | H01L 23/3128 257/712 |
| 8,409,924 B2 | 4/2013 | Tomita et al. | |
| 8,940,584 B2* | 1/2015 | Kim | H01L 23/552 438/118 |
| 2002/0079562 A1* | 6/2002 | Zhao | H01L 23/3735 257/678 |
| 2002/0084524 A1* | 7/2002 | Roh | H01L 23/3128 257/738 |
| 2007/0018319 A1* | 1/2007 | Chen | H01L 23/49816 257/737 |
| 2007/0200210 A1* | 8/2007 | Zhao | H01L 23/3128 257/676 |
| 2014/0078702 A1* | 3/2014 | Mizuno | H01L 23/49822 361/760 |

* cited by examiner

*Primary Examiner* — David Vu
(74) *Attorney, Agent, or Firm* — Foley & Lardner LLP; Cliff Z. Liu

(57) ABSTRACT

At least some embodiments of the present disclosure relate to a semiconductor device package. The semiconductor device package includes a carrier having a first surface and including a power layer adjacent to the first surface of the carrier, an electrical component disposed on the first surface of the carrier, and a conductive element disposed on the first surface of the carrier. The electrical component is electrically connected to the power layer. The conductive element is electrically connected to the power layer. The conductive element, the power layer, and the electrical component form a power-transmission path.

10 Claims, 32 Drawing Sheets

SEMICONDUCTOR DEVICE PACKAGE AND A METHOD OF MANUFACTURING THE SAME

BACKGROUND

1. Technical Field

The present disclosure relates to a semiconductor device package, and to a semiconductor device package including a conductive element connected to a power output, and methods of manufacturing the semiconductor device package and the semiconductor device package including a conductive element connected to a power output.

2. Description of the Related Art

A semiconductor device (e.g. a semiconductor die) package can include a semiconductor device on a carrier (e.g. a substrate). The semiconductor device can be powered by a power supply on a system board or printed circuit board (PCB) via an interconnection structure in the substrate of the semiconductor device. In miniaturized devices having a large number of input/outputs (I/Os), a resistance of the overall semiconductor device package can be large, which may cause significant power loss. One manner to provide sufficient power to the semiconductor device is to use a high-power power supply on the PCB. This can lead to large power consumption by the semiconductor device package. Moreover, the large power consumption may cause thermal problems.

SUMMARY

In some embodiments, according to an aspect, a semiconductor device package includes a carrier having a first surface and including a power layer adjacent to the first surface of the carrier, an electrical component disposed on the first surface of the carrier, and a conductive element disposed on the first surface of the carrier. The electrical component is electrically connected to the power layer. The conductive element is electrically connected to the power layer. The conductive element, the power layer, and the electrical component form a power-transmission path.

In some embodiments, according to another aspect, a semiconductor device package includes a carrier having a first surface, a power layer disposed on the first surface of the carrier, an electrical component disposed on the first surface of the carrier, a conductive element disposed on the first surface of the carrier, and a package body. The electrical component is electrically connected to the power layer. The conductive element is electrically connected to the power layer. The package body encapsulates the conductive element and the electrical component. A surface of the conductive element is exposed from the package body.

In some embodiments, according to still another aspect, a semiconductor device package includes a first carrier including a power output, a second carrier disposed on the first carrier and having a first surface, a power layer disposed on the first surface of the second carrier, an electrical component disposed on the first surface of the second carrier, a conductive element disposed on the first surface of the second carrier, and a connection structure including a first terminal and a second terminal. The electrical component is electrically connected to the power layer. The conductive element is electrically connected to the power layer. The first terminal of the connection structure is connected to the power output and the second terminal of the connection structure is connected to the conductive element.

DETAILED DESCRIPTION

Figure 1A:
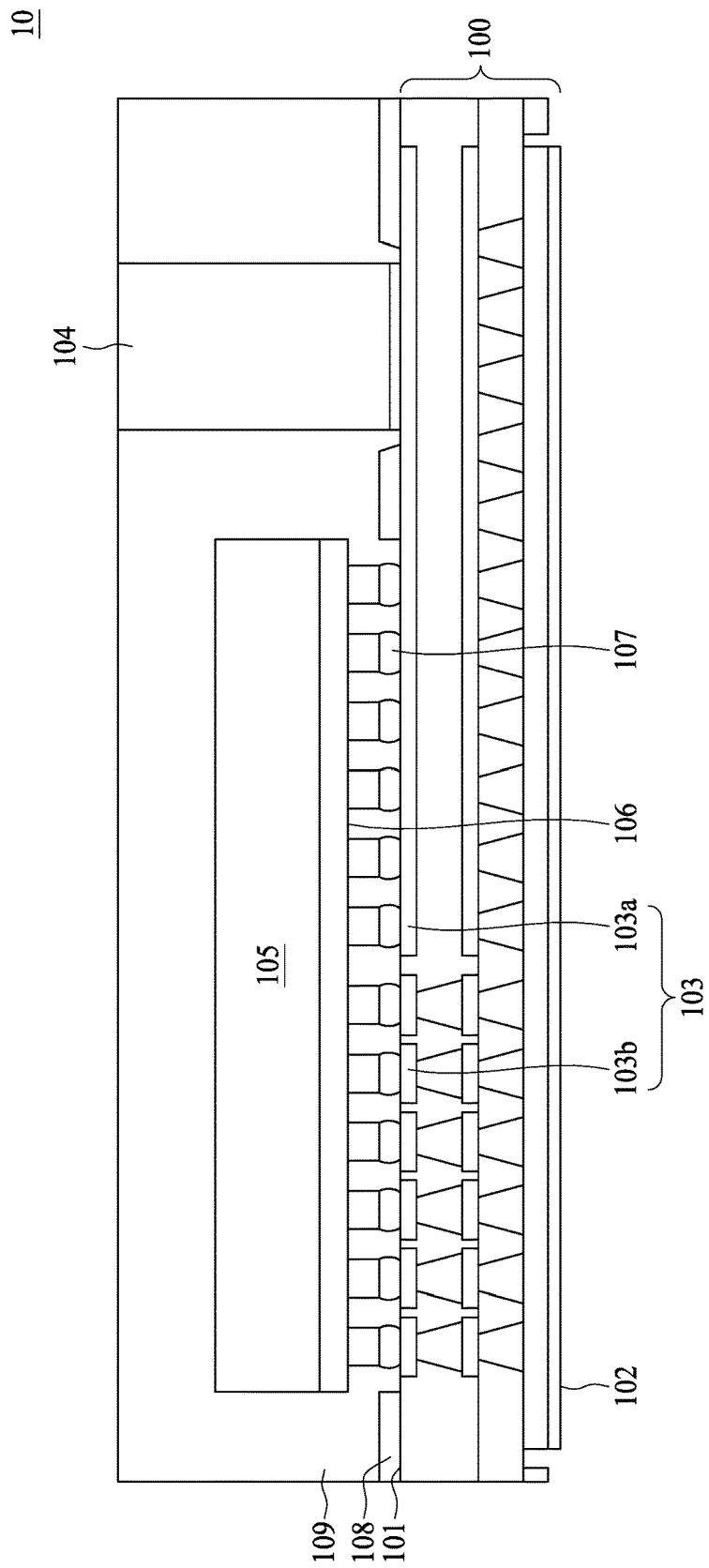
FIG. 1A illustrates a cross-sectional view of some embodiments of a semiconductor device package according to a first aspect of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of some embodiments of a semiconductor device package 10 in accordance with a first aspect of the present disclosure. The semiconductor device package 10 includes a carrier 100, a conductive element 104, an electrical component 105, pads or connectors 107 and a package body 109. The carrier 100 has a top surface 101 and a bottom surface 102 opposite to the top surface 101. The carrier 100 includes a power layer 103. An insulation layer 108 is disposed on the top surface 101 of the carrier 100. The insulation layer 108 is patterned to expose at least a portion of the power layer 103. In some embodiments, the insulation layer 108 may be part of the carrier 100. The conductive element 104 is disposed on the top surface 101 of the carrier 100. In some embodiments, the conductive element 104 may include copper (Cu) and/or other suitable conductive materials. The electrical component 105 has an active surface 106. The active surface 106 of the electrical component 105 is disposed on and electrically connected to the top surface 101 of the carrier 100 through the pads 107. In some embodiments, the electrical component 105 may include an application-specific integrated circuit (ASIC), a die, a controller, a processor or other electronic component or semiconductor device. The electrical component 105 may include a flip-chip type semiconductor device, and may be mounted via a flip-chip process. The electrical component 105 may include a wire-bond type semiconductor device, and may be electrically connected to other components via wire-bonding. The package body 109 encapsulates at least a portion of the first surface 101 of the carrier 100, the conductive element 104, the electrical component 105, and the insulation layer 108. The top surface of the conductive element 104 is exposed from the package body 109.

The power layer 103 is an outer-most circuit layer of the carrier 100 (e.g. at least a portion of the power layer 103 is disposed on or at an outer surface of the carrier 100, such as, in some implementations, the surface 101). The power layer 103 includes a first portion 103a and a second portion 102b. The second portion 103b is separated from the first portion 103a. The first portion 103a and the second portion 103b are electrically connected to the pads 107. At least one pad of the pads 107 contacts the first portion 103a of the power layer 103. At least another pad of the pads 107 contacts the second portion 103b of the power layer 103. The second portion 103b may be correspondingly connected to conductive vias in the carrier 100. The first portion 103a and the second portion 103b of the power layer 103 are partially exposed from the insulating layer 108. The conductive element 104 is electrically connected to the first portion 103a of the power layer 103. The conductive element 104, the power layer 103, and the electrical component 105 form a power-transmission path.

In some embodiments, the carrier 100 may be or include, for example, a printed circuit board (PCB), such as a paper-based copper foil laminate, a composite copper foil laminate, or a polymer-impregnated glass-fiber-based copper foil laminate. The carrier 100 may include a core layer which includes a bismaleimide-triazine (BT) resin or a glass-reinforced epoxy composite (e.g. a grade-4 flame retardant (FR-4) composite). The carrier 100 may include an interconnection structure, such as a redistribution layer (RDL). The interconnection structure may include one or more pads, vias, or conductive layers. The carrier 100 may include a grounding element. In some embodiments, the grounding element is a via that is exposed from, for example, a lateral surface of the carrier 100. In some embodiments, the grounding element is a metal layer exposed from the lateral surface of the carrier 100. In some embodiments, the grounding element is a metal trace exposed from the lateral surface of the carrier 100. In some embodiments, the carrier 100 of the semiconductor device package 10 may be disposed on (e.g. attached to) another carrier (e.g. a system board or a PCB).

Figure 1B:
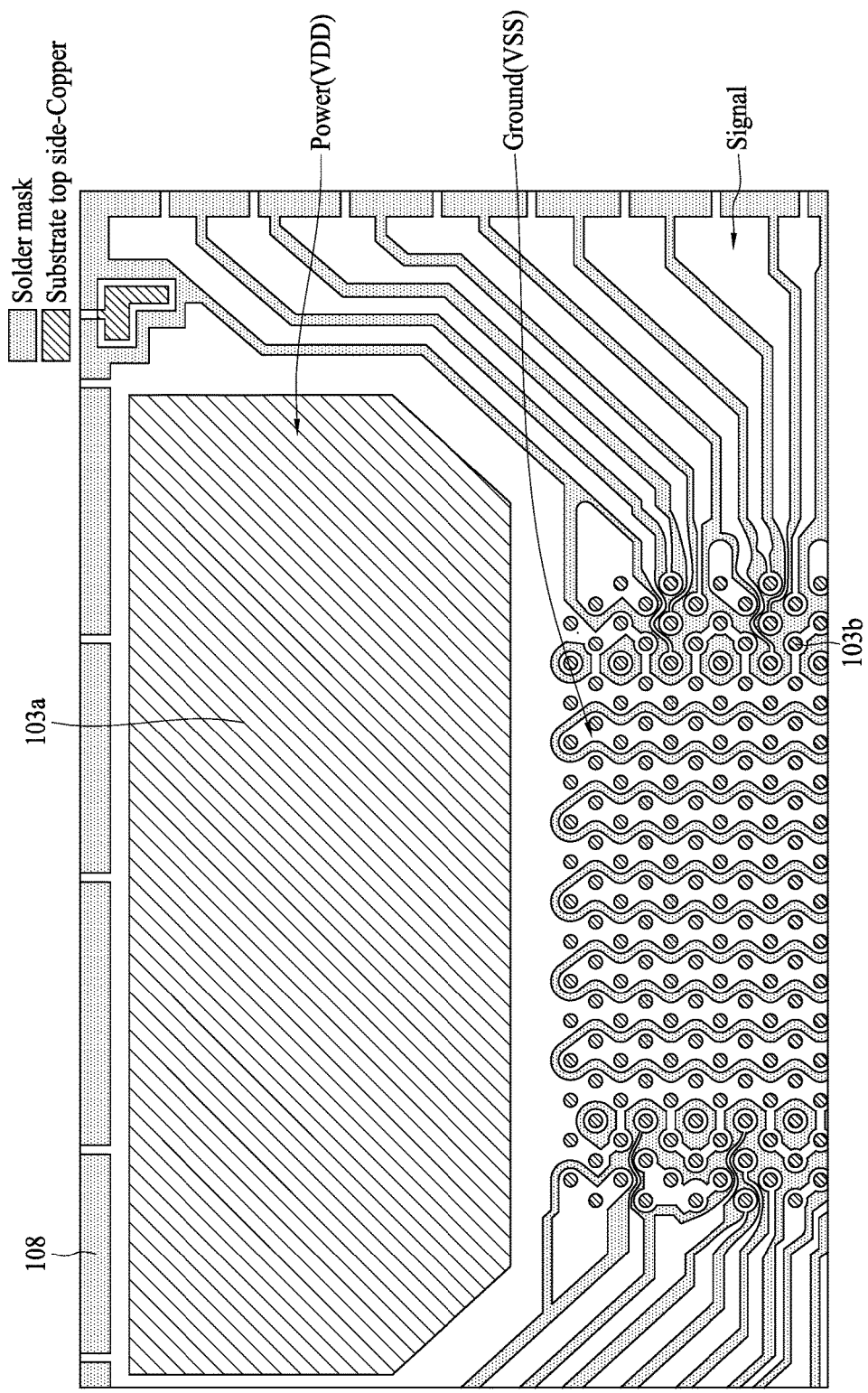
FIG. 1B illustrates a layout of some embodiments of a semiconductor device package according to the first aspect of the present disclosure.

FIG. 1B shows a layout of the semiconductor device package 10 according to some embodiments of the present disclosure. A power VDD is provided from a power output to the first portion 103a of the power layer 103 through the conductive element 104 such that the power is provided to the electrical component 105 through a power-transmission path. A voltage VSS is provided to the second portion 103b of the power layer 103 (which can serve as a ground). In some embodiments, a signal may be provided to the second portion 103b of the power layer 103. The voltage settings of the power layer 103 (including the first portion 103a and the second portion 103b) may be set or adjusted based on design specifications. Since the power VDD is provided to the first portion 103a of the power layer 103 (which can be an outer-most circuit layer), an overall resistance of the carrier 100 can be decreased.

Figure 2A:
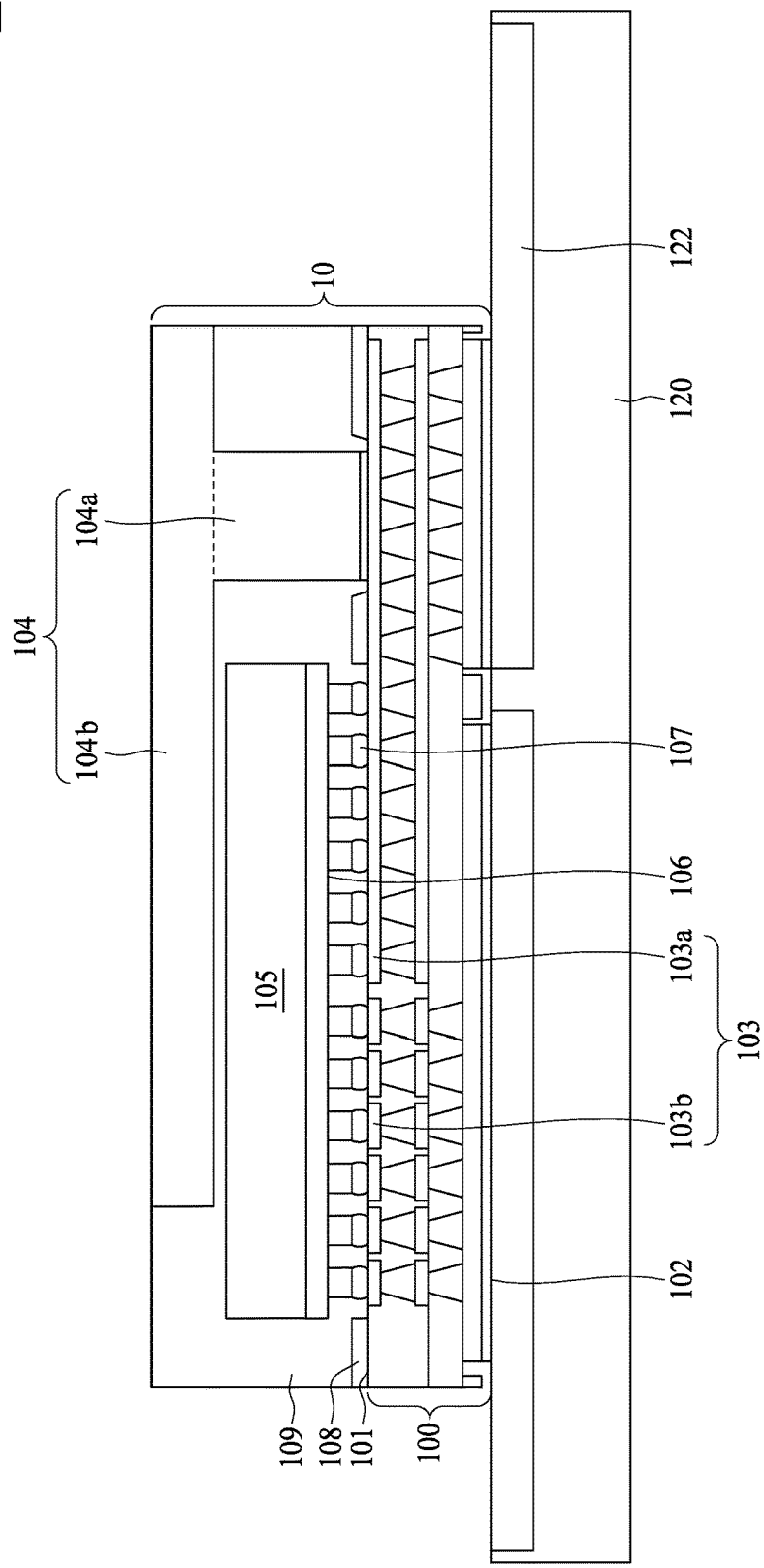
FIG. 2A illustrates a cross-sectional view of some embodiments of a semiconductor device package according to a second aspect of the present disclosure.

FIG. 2A shows some embodiments of a cross-sectional view of a semiconductor device package 20 in accordance with a second aspect of the present disclosure. The semiconductor device package 20 includes the semiconductor device package 10 (as shown in FIG. 1A) and a carrier 120. The carrier 100 of the semiconductor device package 10 is disposed on (e.g. attached to) the carrier 120. In some embodiments, a conductive layer (e.g. a layer including tin (Sn)) may be disposed on an interface between the carrier 100 and the carrier 120. The conductive element 104 includes a first portion 104a and a second portion 104b.

The second portion 104b of the conductive element 104 extends over the electrical component 105. Since the second portion 104b may dissipate heat from the electrical component 105, the thermal performance of the semiconductor device package 20 can be enhanced by inclusion of the second portion 104b. In some embodiments, the extension length of the second portion 104b of the conductive element 104 may be set based on design specifications. In some embodiments, the extension length of the second portion 104b of the conductive element 104 may cover substantially all of the electrical component 105. In some embodiments, a thermal conductive layer (e.g. a layer including Sn) may be plated on the second portion 104b of the conductive element 104 and the package body 109 and may connect to a heat spreader. In some embodiments, the conductive layer may be omitted. A top surface of the second portion 104b of the conductive element 104 may be exposed from the package body 109.

The carrier 120 includes a conductive layer 122. The carrier 100 is disposed on (e.g. attached to) the carrier 120. The conductive layer 122 of the carrier is electrically connected to the interconnection structure of the carrier 100. In some embodiments, the carrier 120 may be similar to, or the same as the carrier 100.

Figure 2B:
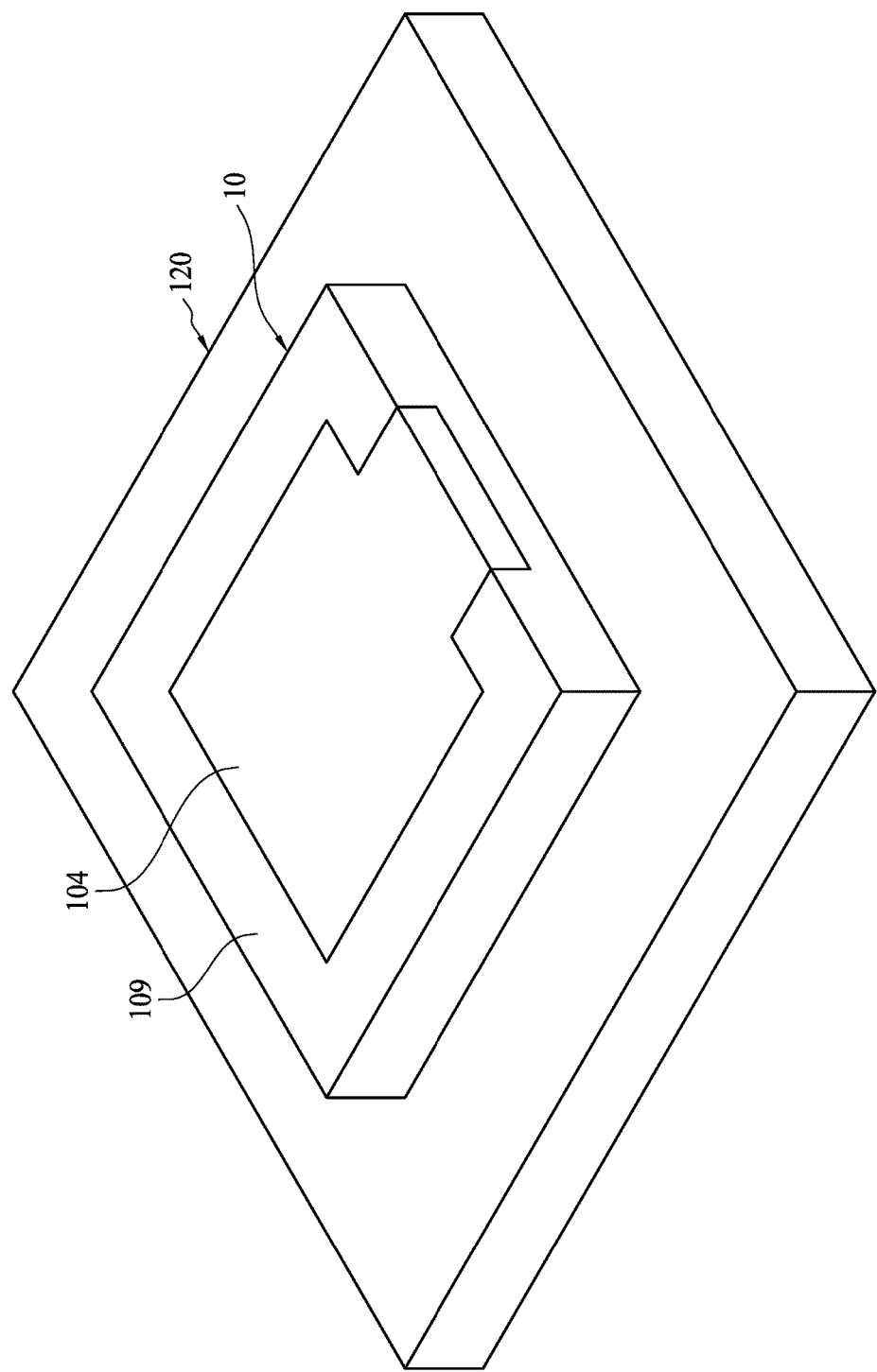
FIG. 2B illustrates a perspective view of some embodiments of a semiconductor device package according to the second aspect of the present disclosure.

FIG. 2B is a perspective view of the semiconductor device package 20 in accordance with some embodiments of the present disclosure. A top surface of the conductive element 104 is exposed from the package body 109. A surface area of the top surface of the conductive element 104 may be set based on design specifications. The top surface of the conductive element 104 may cover substantially all of the package body 109.

In some embodiments, the semiconductor device package 10 of the semiconductor device package 20 may be protected by an outside housing defining a socket. The outside housing may cover substantially all of the semiconductor device package 10. The semiconductor device package 10 may be electrically connected to the carrier 120 through the socket of the outside housing. The outside housing can be configured to isolate the semiconductor device package 10 from an outside environment and to protect the semiconductor device package 10 from outside contaminations. The outside housing can provide for heat dissipation such that heat generated in the semiconductor device package 10 can spread to air through the outside housing.

Figure 3A:
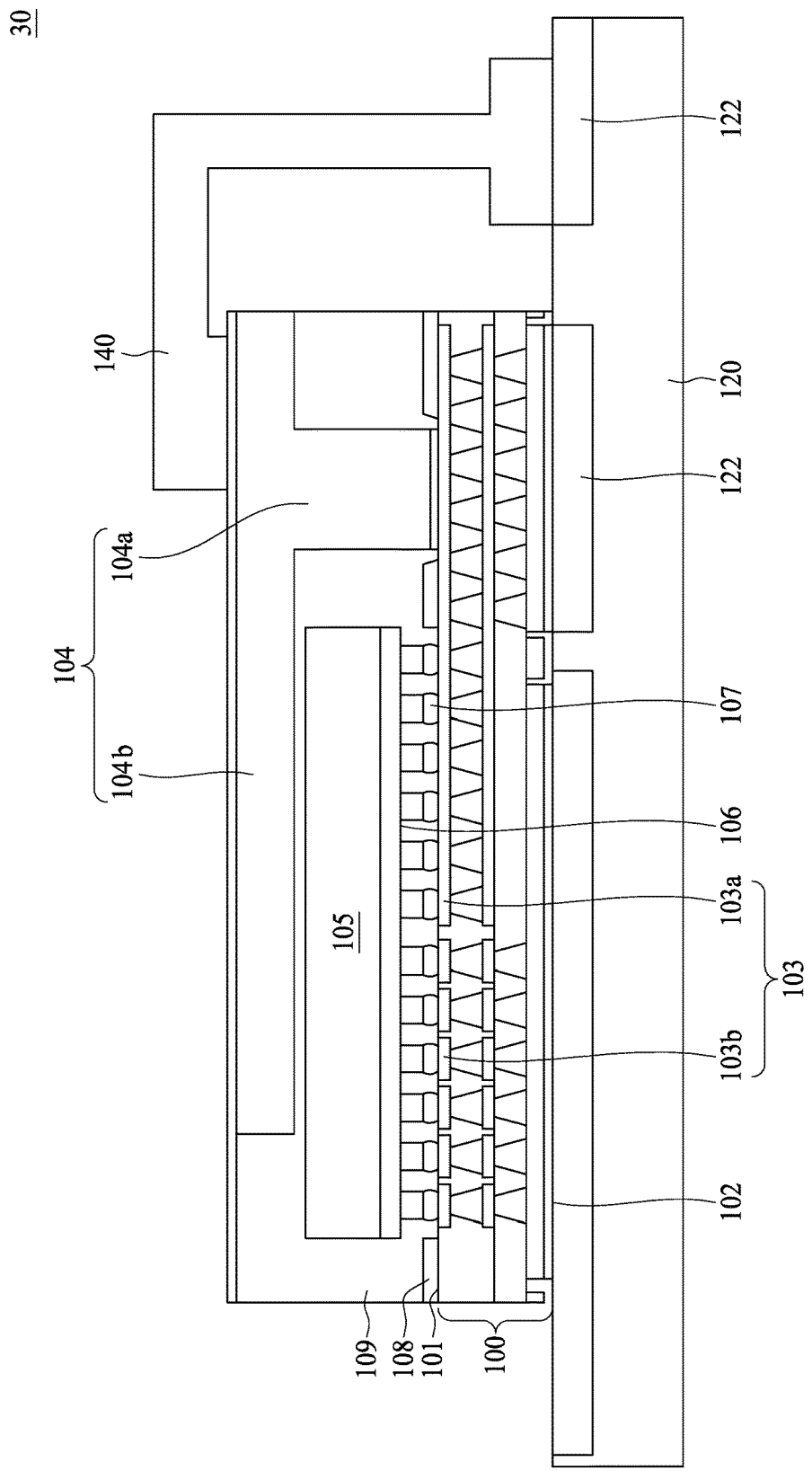
FIG. 3A illustrates a cross-sectional view of some embodiments of a semiconductor device package according to a third aspect of the present disclosure.

FIG. 3A is a cross-sectional view of some embodiments of a semiconductor device package 30 according to a third aspect of the present disclosure. The semiconductor device package 30 is similar to the semiconductor device package 20 shown in FIG. 2A, except that a connection structure 140 electrically connects the conductive element 104 to the conductive layer 122. The connection structure 140 has a first terminal and a second terminal. The first terminal of the connection structure 140 is connected to the conductive layer 122. The second terminal of the connection structure 140 is connected to the second portion 104b of the conductive element 104. In some embodiments, the connection structure 140 electrically connects to the conductive element 104 via a conductive layer. The conductive layer may be selectively disposed on the interface between the connection structure 140 and the conductive element 104, and substantially not on other portions of the conductive element 104. The connection structure 140 can extend above and laterally across at least a portion of the conductive element 104, and can include a portion that extends downwards towards the conductive element 104.

Figure 3B:
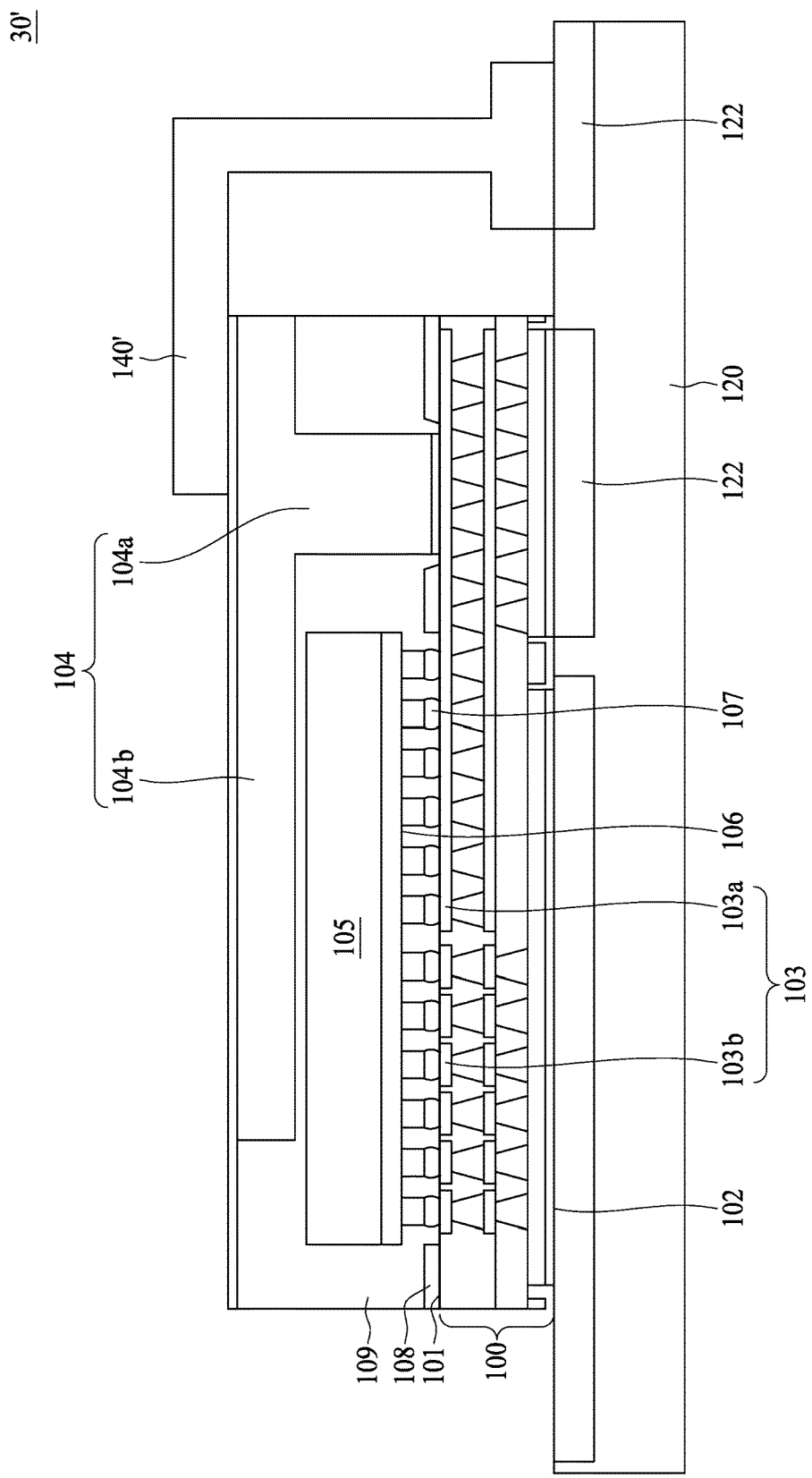
FIG. 3B illustrates a cross-sectional view of some embodiments of a semiconductor device package according to the third aspect of the present disclosure.

FIG. 3B is a cross-sectional view of some embodiments of a semiconductor device package 30' according to the third aspect of the present disclosure. The semiconductor device package 30' is similar to the semiconductor device package 30 shown in FIG. 3A, except that it includes a connection structure 140' having a different shape than that of the connection structure 140. The shape of the connection structure 140' can be inverse L-shaped. The connection structure 140' can extend upwards (e.g. substantially directly upwards) from the conductive layer 122, and can extend laterally across at least a portion of the conductive element 104, and the laterally extended portion can be in contact with the connection structure 104 and/or with a conductive layer disposed on the connection structure 104.

Figure 3C:
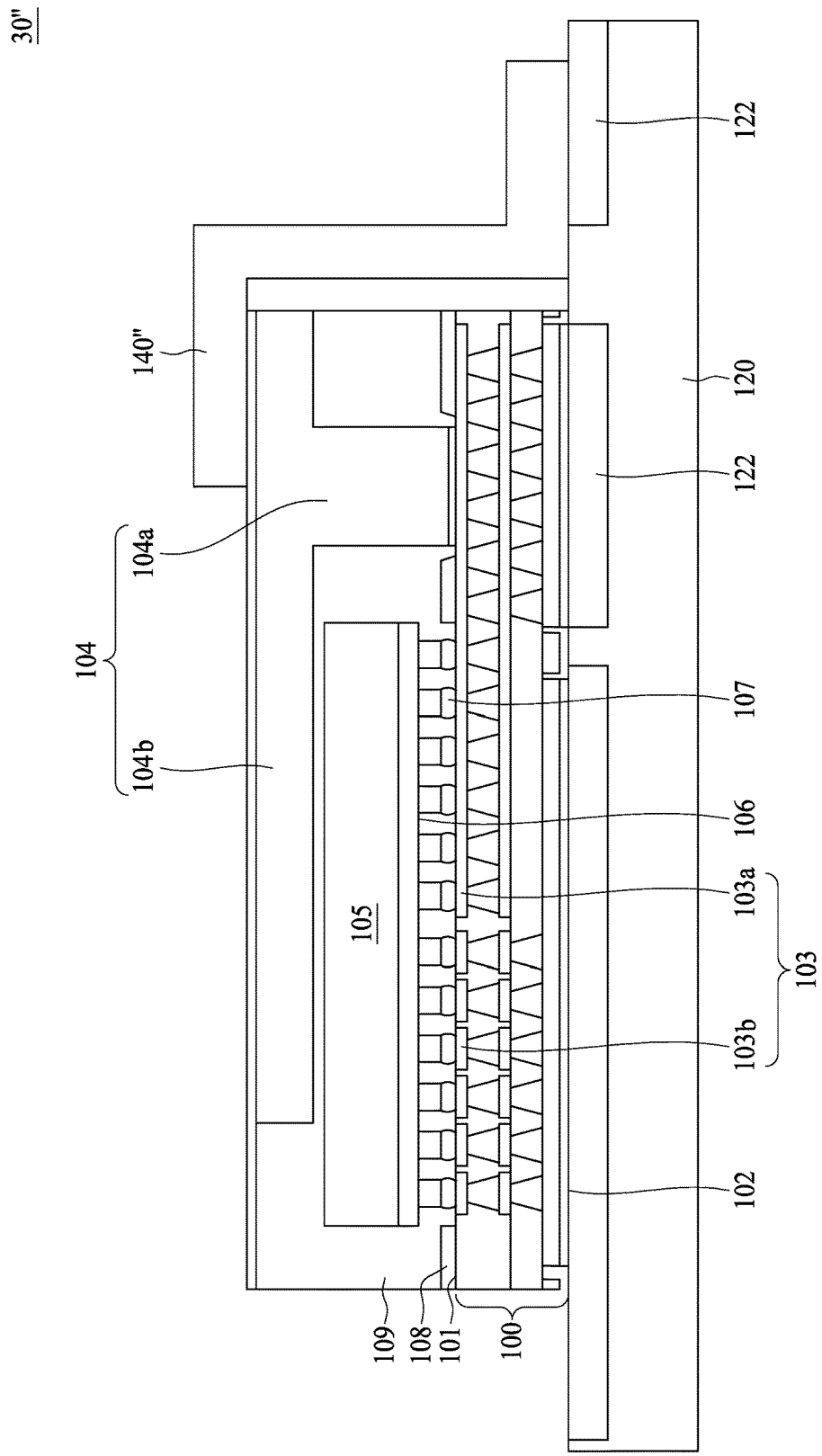
FIG. 3C illustrates a cross-sectional view of some embodiments of a semiconductor device package according to the third aspect of the present disclosure.

FIG. 3C is a cross-sectional view of some embodiments of a semiconductor device package 30" according to the third aspect of the present disclosure. The semiconductor device package 30" is similar to the semiconductor device package 30' shown in FIG. 3B, except that the semiconductor device package 30" includes a connection structure 140" having a different shape than that of the connection structure 140'. The shape of the connection structure 140" is zig-zag. The connection structure 140" can extend laterally across at least a portion of the conductive layer 122, and can further extend across at least a portion of a top surface of the carrier 120.

Figure 3D:
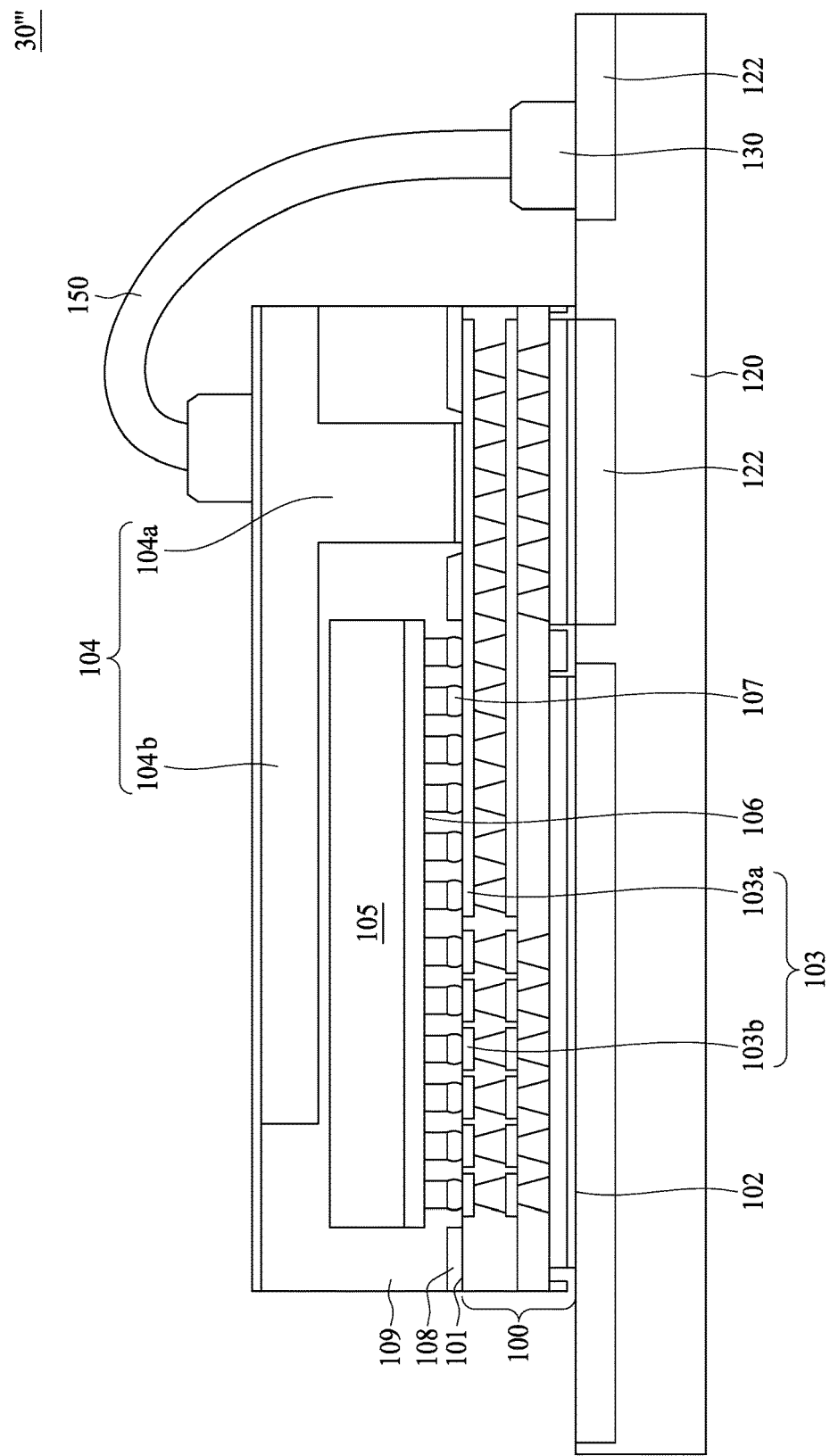
FIG. 3D illustrates a cross-sectional view of some embodiments of a semiconductor device package according to the third aspect of the present disclosure.

FIG. 3D is a cross-sectional view of some embodiments of a semiconductor device package 30''' according to the third aspect of the present disclosure. The semiconductor device package 30''' is similar to the semiconductor device package 30 shown in FIG. 3A, except that the connection structure 150 is a socket type. The carrier 120 has a power output 130 disposed on the conductive layer 122. The connection structure 150 has a first terminal and a second terminal. The first terminal of the connection structure 150 is connected to the power output 130. The second terminal of the connection structure 150 is connected to the second portion 104b of the conductive element 104.

Figure 3E:
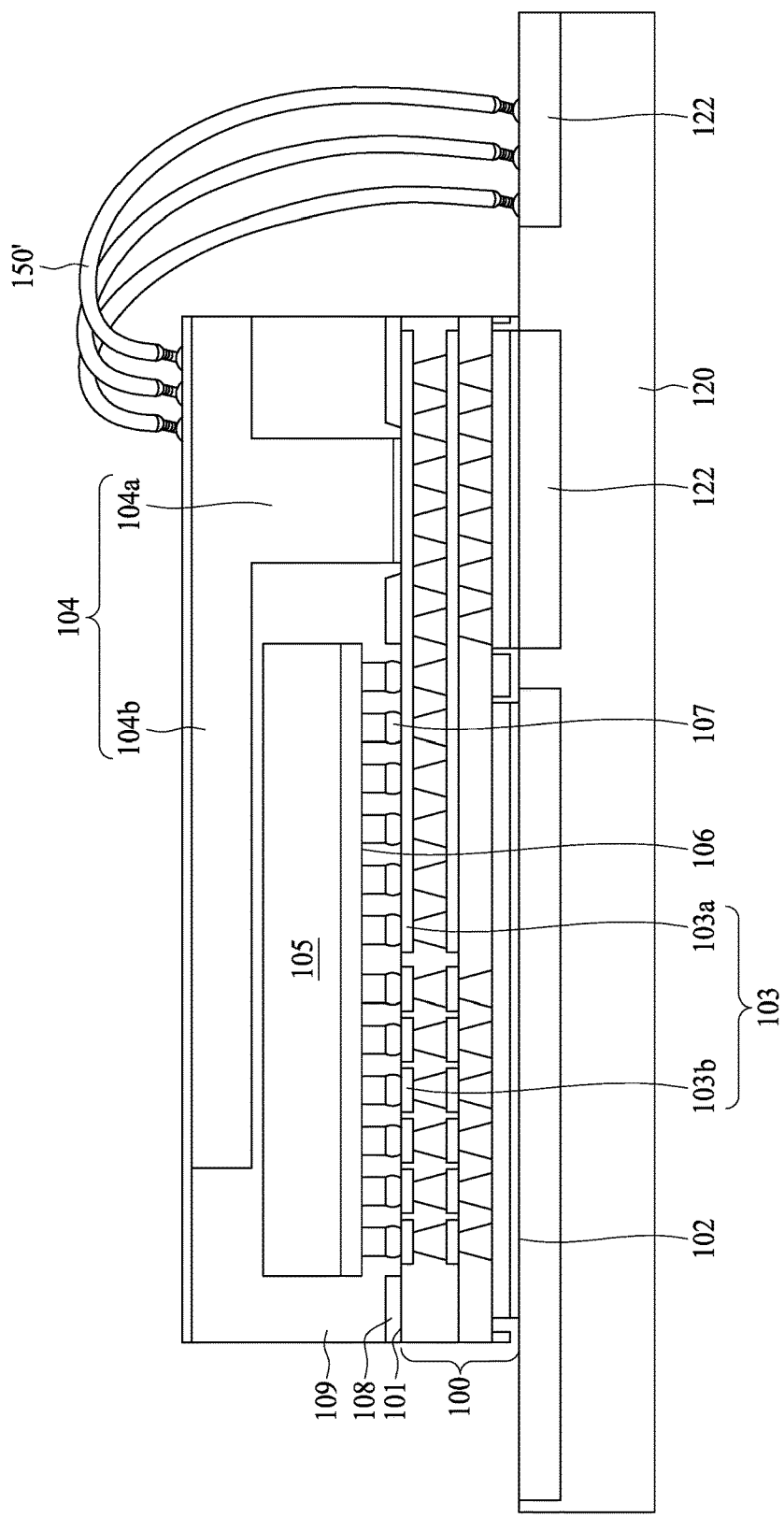
FIG. 3E illustrates a cross-sectional view of some embodiments of a semiconductor device package according to the third aspect of the present disclosure.

FIG. 3E is a cross-sectional view of some embodiments of a semiconductor device package 30'''' according to the third aspect of the present disclosure. The semiconductor device package 30'''' is similar to the semiconductor device package 30''' shown in FIG. 3D, except that the connection structure 150' is a wire-soldering type and the connection structure 150' connects between the second portion 104b of the conductive element 104 and the conductive layer 122 of the carrier 120. The connection structure 150' may include one, two, or more wires, each wire bonded to both the conductive layer 122 and to the second portion 104b of the conductive element 104.

Figure 3F:
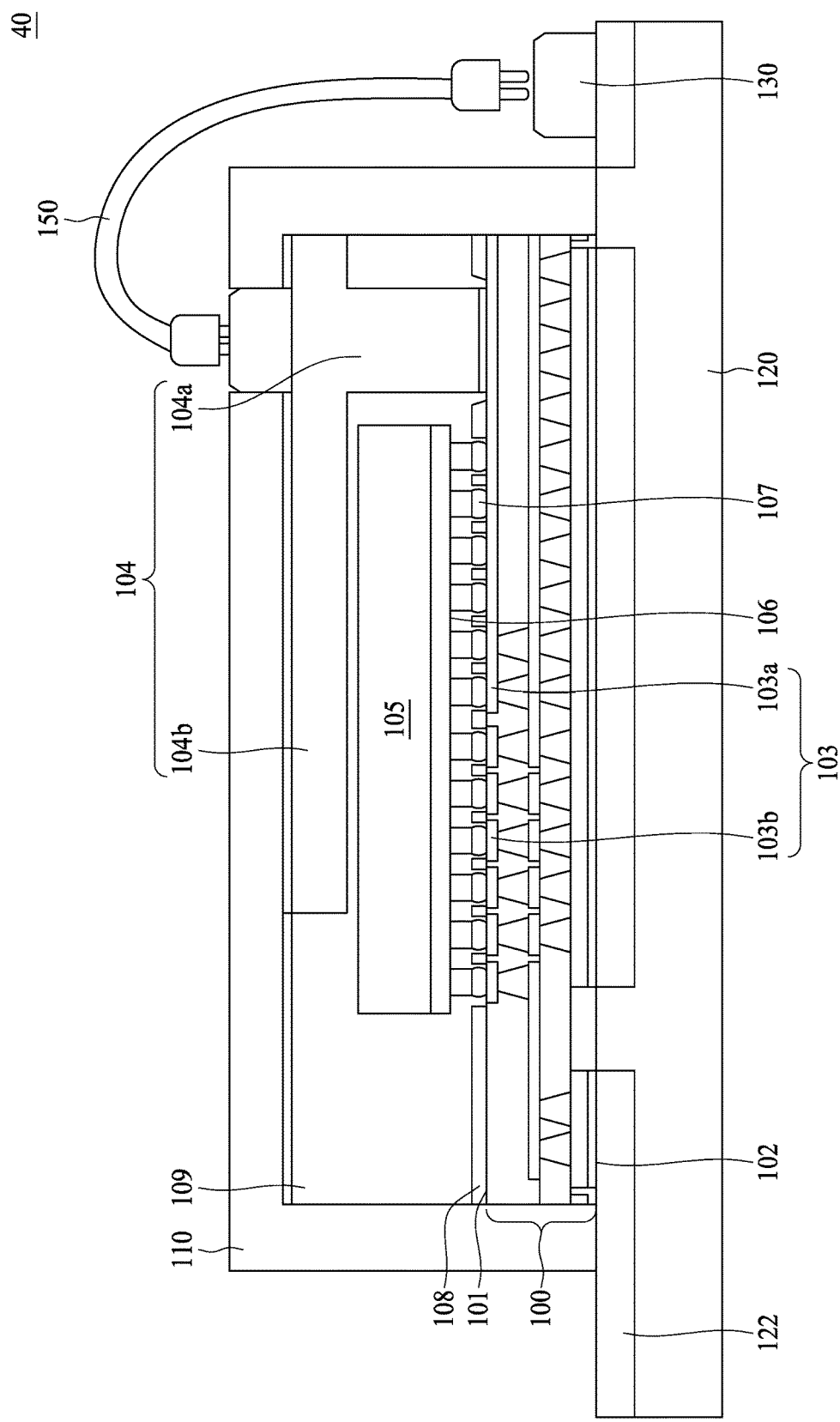
FIG. 3F illustrates a cross-sectional view of some embodiments of a semiconductor device package according to the third aspect of the present disclosure.

FIG. 3F is a cross-sectional view of some embodiments of a semiconductor device package 40 according to the third aspect of the present disclosure. The semiconductor device package 40 is similar to the semiconductor device package 30''' shown in FIG. 3D, except that a heat spreader 110 is disposed on the package body 109 and connected to the conductive element 104. The heat generated in the semiconductor device package can spread to air through the heat spreader 110. The heat spreader 110 defines an opening (which can, for example, provide for the connection structure 150 connecting to the conductive element 104 (e.g. via a power output 130). A location at which the connection structure 150 connects to the conductive element 104 (or to the power output 130) may correspond to (e.g. may be above at least a portion of) the first portion 104a of the conductive element 104.

FIG. 4A, FIG. 4B, FIG. 4C, FIG. 4D, FIG. 4E, FIG. 4F, FIG. 4G, and FIG. 4H illustrate some embodiments of a method of manufacturing a semiconductor device package according to some embodiments of the present disclosure.

Figure 4A:
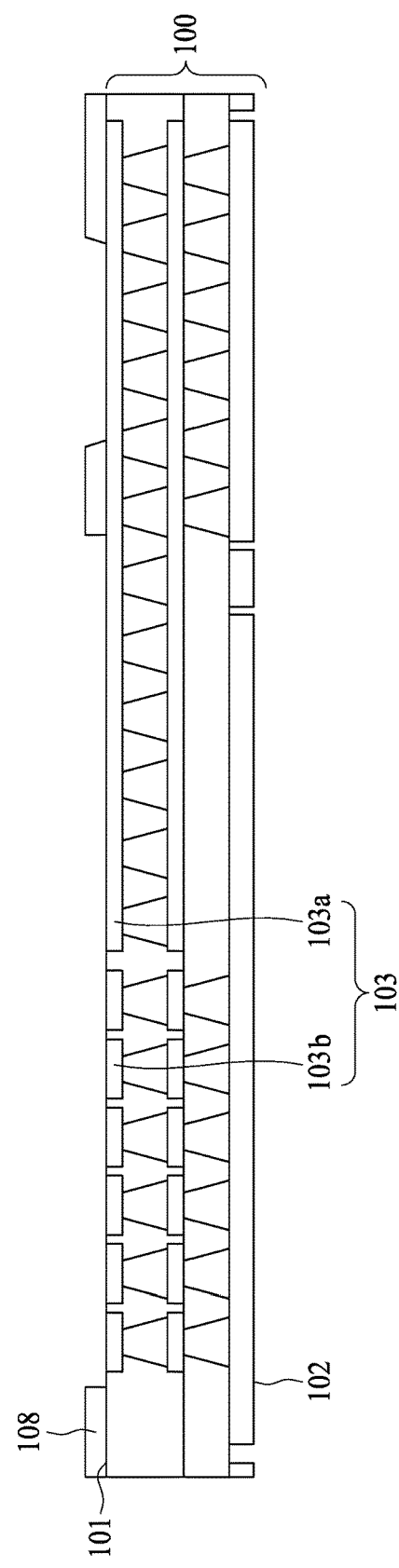
FIG. 4A illustrates some embodiments of a method of manufacturing a semiconductor device package according to some embodiments of the present disclosure.

Referring to FIG. 4A, a method for manufacturing a semiconductor device package includes providing the carrier 100. The carrier 100 has a front side (e.g. the top surface 101) and a back side (e.g. the bottom surface 102). The carrier 100 includes the power layer 103 including the first portion 103a and the second portion 103b. The insulation layer 108 is disposed on the top surface 101 of the carrier 100. The insulation layer 108 is patterned to expose part of the power layer 103.

Figure 4B:
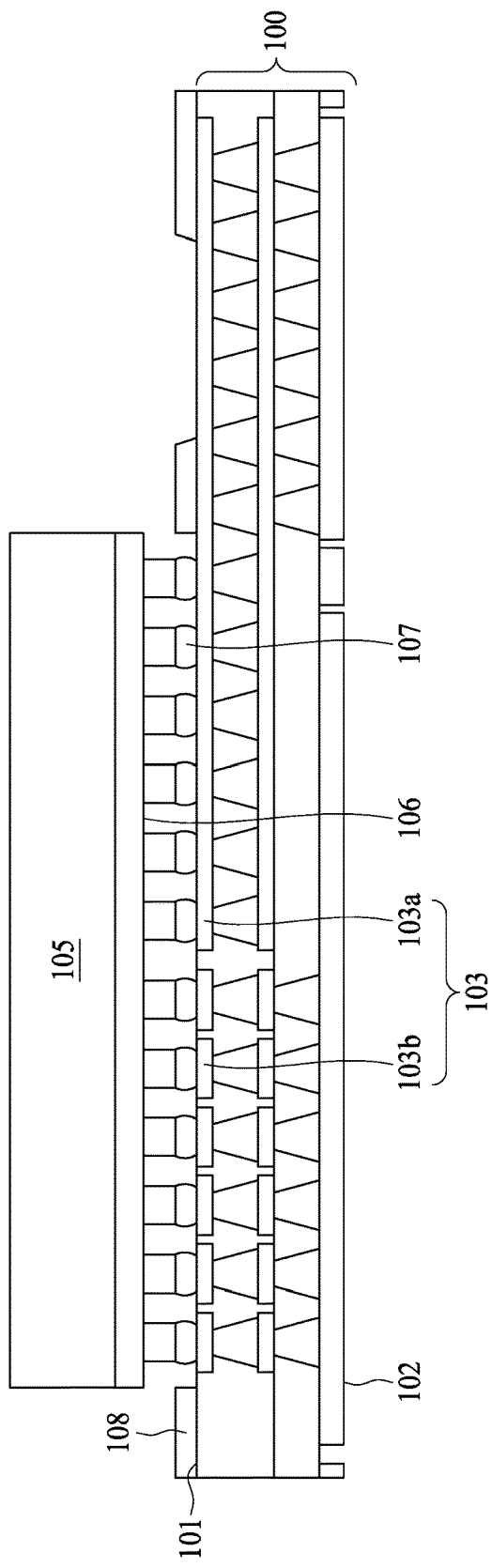
FIG. 4B illustrates some embodiments of a method of manufacturing a semiconductor device package according to some embodiments of the present disclosure.

Referring to FIG. 4B, the electrical component 105 is flipped and disposed on the power layer 103 through the pads 107. The active surface of the electrical component 105 faces the top surface 101 of the carrier 100.

Figure 4C:
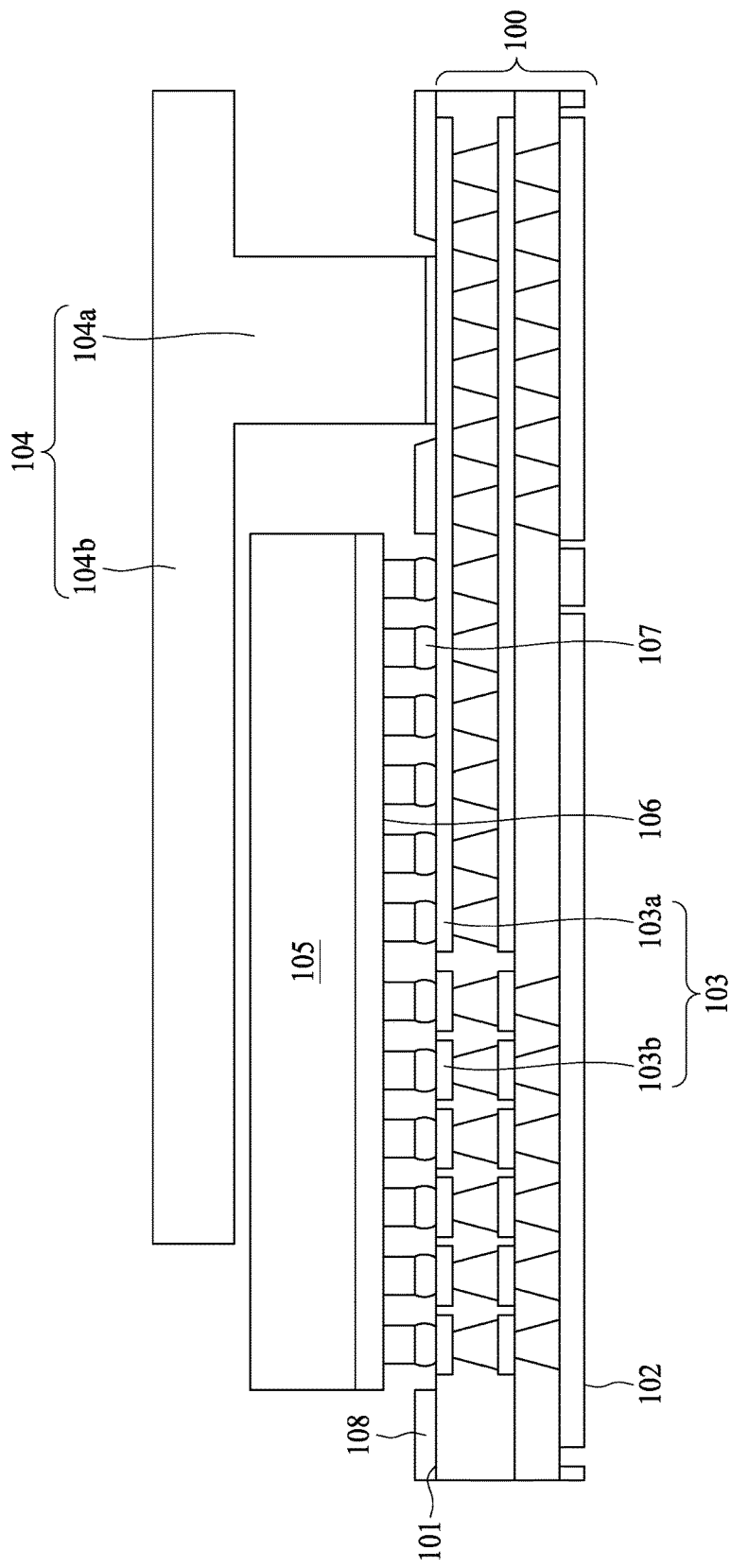
FIG. 4C illustrates some embodiments of a method of manufacturing a semiconductor device package according to some embodiments of the present disclosure.

Referring to FIG. 4C, the conductive element 104 is disposed on the top surface 101 of the carrier 100. The first portion 104a of the conductive element 104 is electrically connected to the first portion 103a of the power layer 103.

Figure 4D:
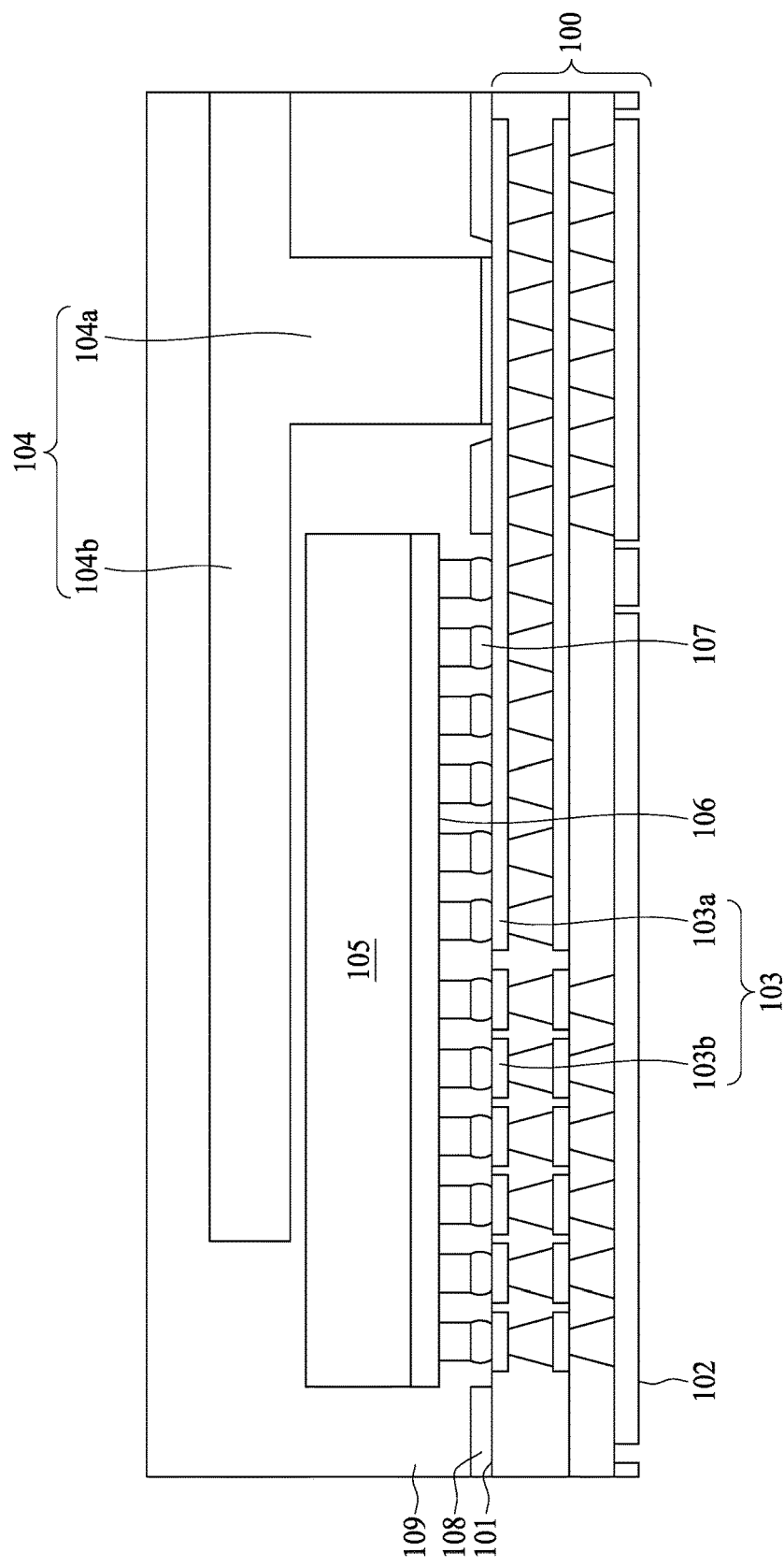
FIG. 4D illustrates some embodiments of a method of manufacturing a semiconductor device package according to some embodiments of the present disclosure.

Referring to FIG. 4D, the package body 109 is molded on the top surface 101 of the carrier 100. The package body 109 encapsulates at least a portion of the first surface 101 of the carrier 100, the conductive element 104, the electrical component 105, and the insulation layer 108.

Figure 4E:
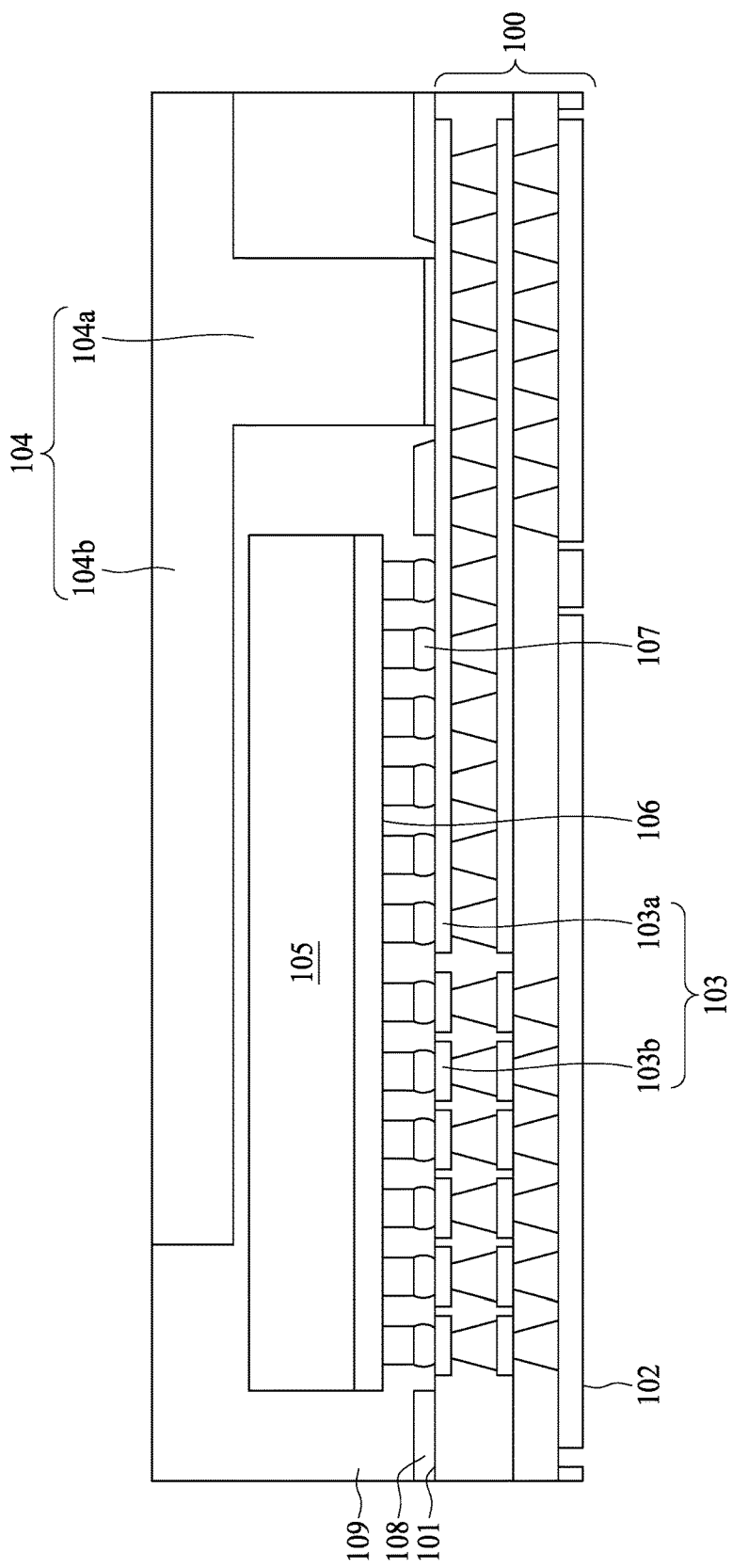
FIG. 4E illustrates some embodiments of a method of manufacturing a semiconductor device package according to some embodiments of the present disclosure.

Referring to FIG. 4E, the package body 109 is ground (or otherwise partially removed) so as to expose the top surface of the second portion 104b of the conductive element 104.

Figure 4F:
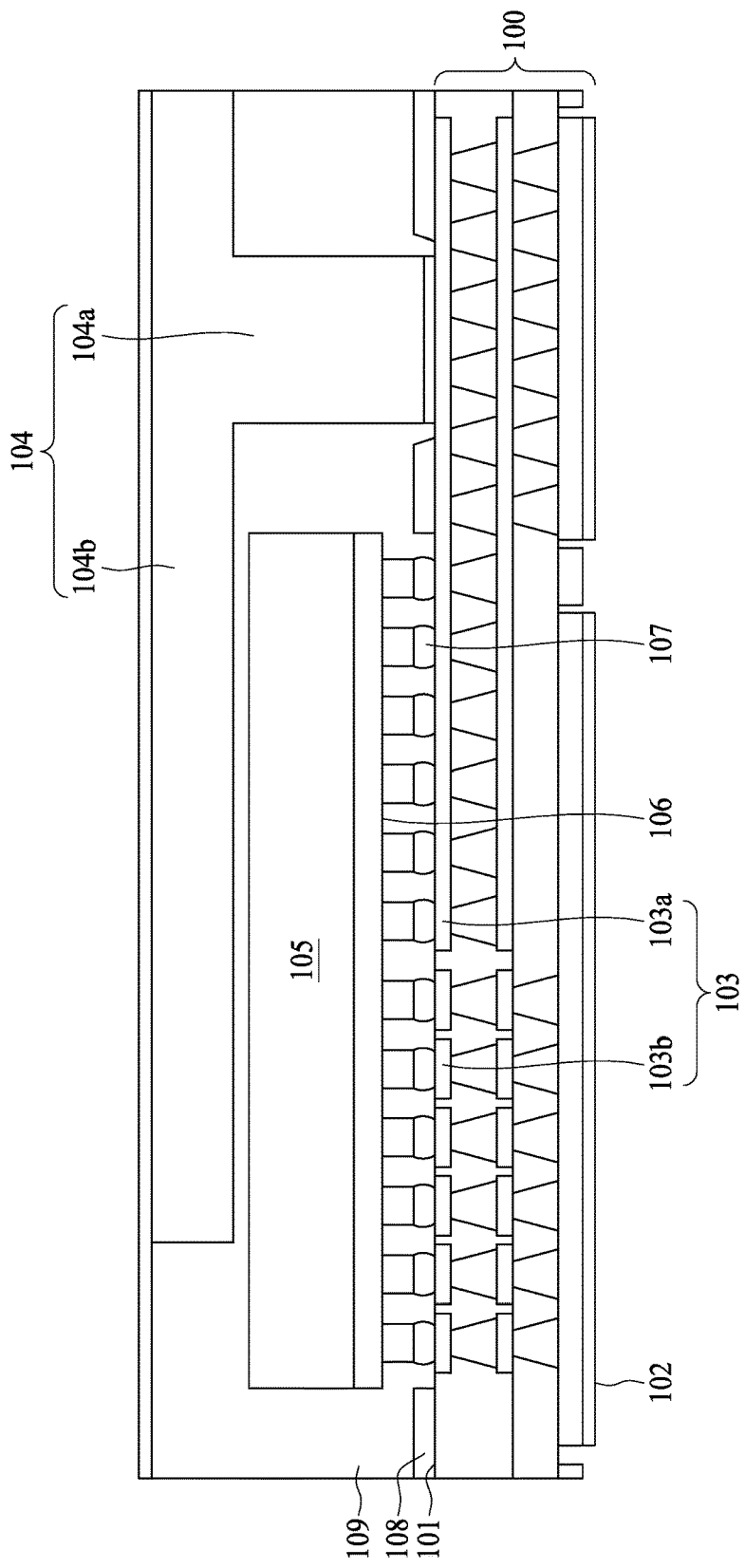
FIG. 4F illustrates some embodiments of a method of manufacturing a semiconductor device package according to some embodiments of the present disclosure.

Referring to FIG. 4F, a conductive layer (e.g. a thermal conductive layer) is plated on the second portion 104b of the conductive element 104 and the package body 109. The conductive layer may include tin (Sn) and/or other suitable conductive materials. In some embodiments, a second conductive layer may be plated on the bottom surface 102 of the carrier 100. The second conductive layer may include the same or similar material as that of the conductive layer.

Figure 4G:
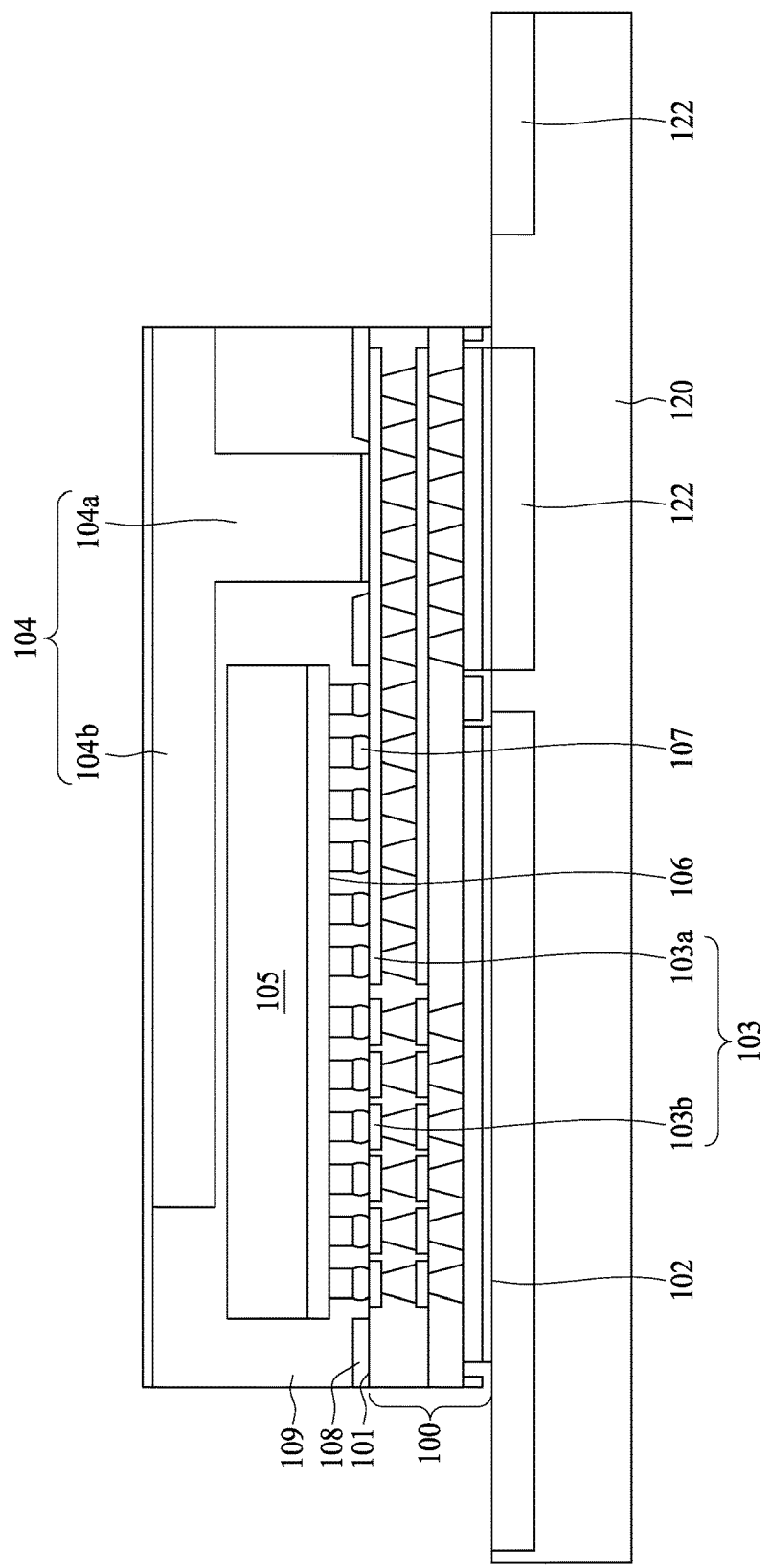
FIG. 4G illustrates some embodiments of a method of manufacturing a semiconductor device package according to some embodiments of the present disclosure.

Referring to FIG. 4G, the carrier 100 is disposed on (e.g. attached to) a carrier 120.

Figure 4H:
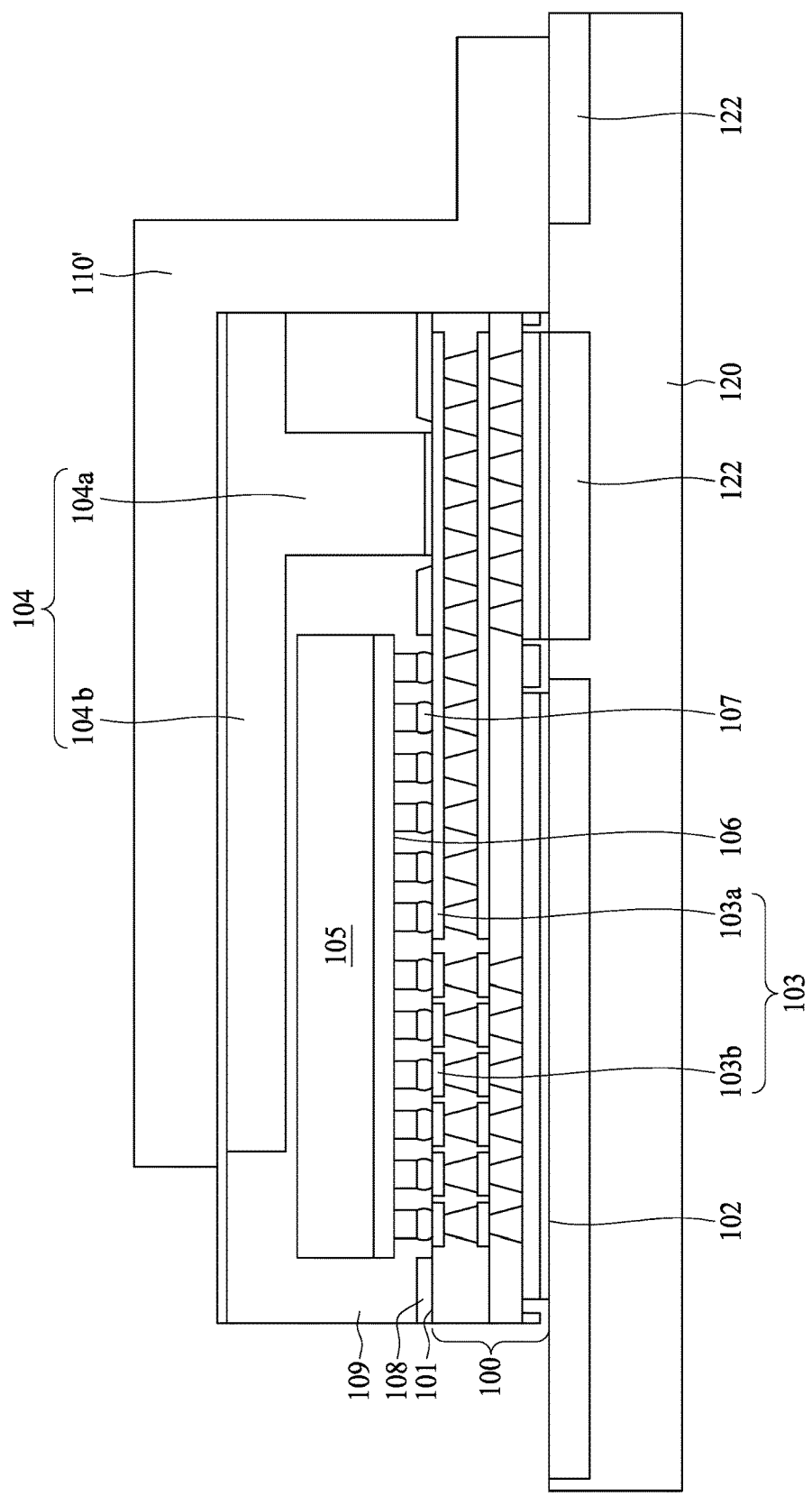
FIG. 4H illustrates some embodiments of a method of manufacturing a semiconductor device package according to some embodiments of the present disclosure.

Referring to FIG. 4H, a heat spreader 110' is disposed on the package body 109 and the carrier 120. The heat spreader 110' is connected to the conductive element 104 and the conductive layer 122. The heat spreader 110' extends over the second portion 104b of the conductive element 104 and the electrical component 105. The heat spreader 110' can provide for enhanced thermal performance of the semiconductor device package (which can be, for example, the semiconductor device package 30' shown in FIG. 3B). In some embodiments, the heat spreader 110' may define an opening. The position of the opening may correspond to (e.g. may be above at least a portion of) the first portion 104a of the conductive element 104 such that at least one connection structure (e.g. the connection structure 150 shown in FIG. 3F) may connect the conductive element 104 to a power output on the carrier 120.

Figure 5A:
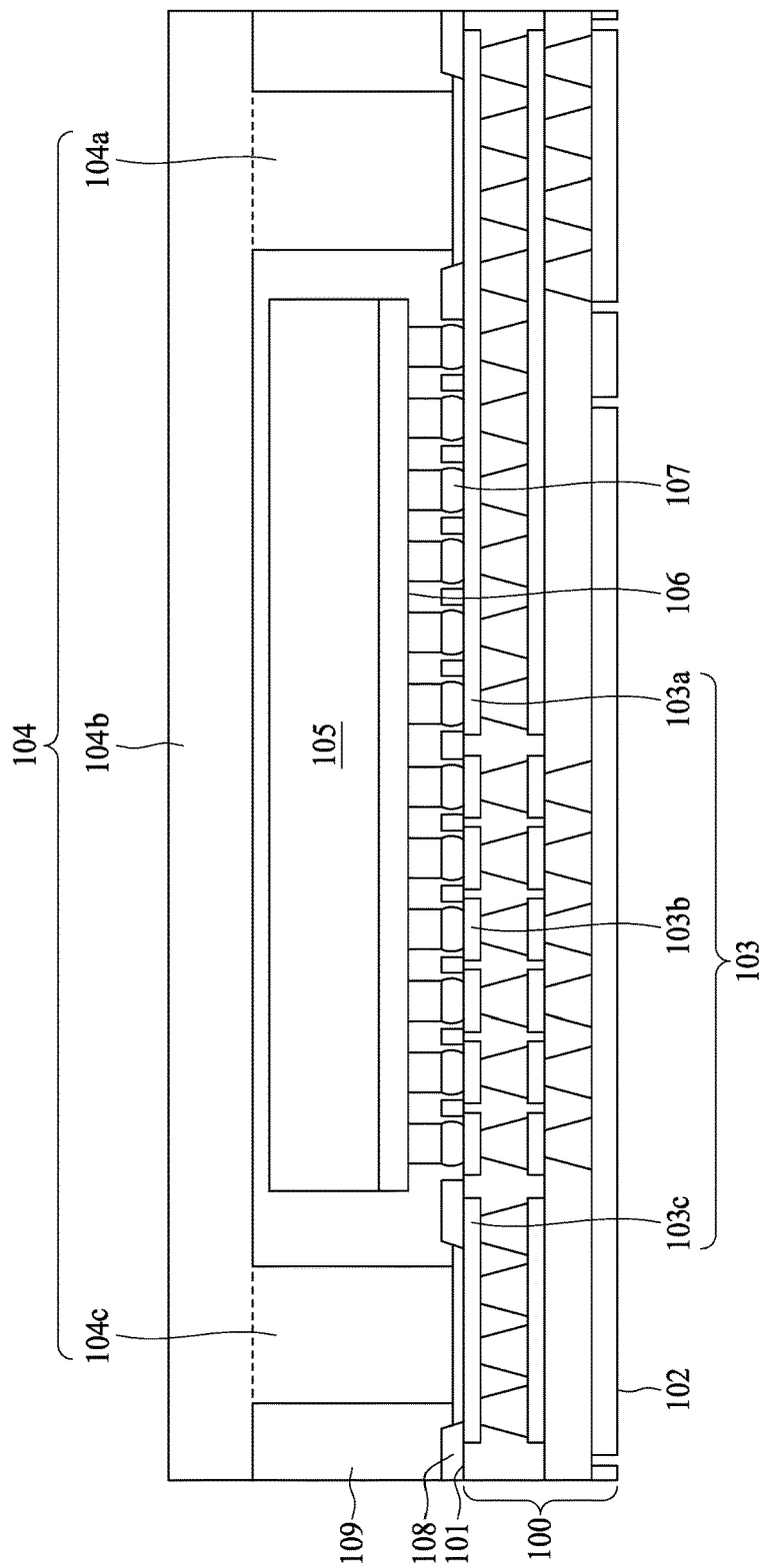
FIG. 5A illustrates a cross-sectional view of some embodiments of a semiconductor device package according to a fourth aspect of the present disclosure.

FIG. 5A is a cross-sectional view of some embodiments of a semiconductor device package 50 according to a fourth aspect of the present disclosure. The semiconductor device package 50 includes a carrier 100, a conductive element 104, an electrical component 105, pads 107 and a package body 109. The carrier 100 has a top surface 101 and a bottom surface 102 opposite to the top surface 101. An insulation layer 108 is disposed on the top surface 101 of the carrier 100. In some embodiments, the insulation layer 108 may be part of the carrier 100. The insulation layer 108 is patterned to expose at least a portion of the power layer 103. The conductive element 104 is disposed on the top surface 101 of the carrier 100. In some embodiments, the conductive element 104 may include Cu and/or other suitable conductive materials. The electrical component 105 is disposed on the top surface 101 of the carrier 100 through the pads 107. In some embodiments, the electrical component 105 may include an application-specific integrated circuit (ASIC), a die, a controller, a processor or other electronic component or semiconductor device. The electrical component 105 may include a flip-chip type semiconductor device, and may be mounted via a flip-chip process. The electrical component 105 may include a wire-bond type semiconductor device, and may be electrically connected to other components via wire-bonding. The package body 109 encapsulates at least a portion of the first surface 101 of the carrier 100, the conductive element 104, the electrical component 105, and the insulation layer 108. The top surface of the conductive element 104 is exposed from the package body 109. In some embodiments, a thermal conductive layer (e.g. including Sn) may be plated on the top surface of the conductive element 104 and connected to a heat spreader. In some embodiments, the conductive layer may be omitted.

The power layer 103 is an outer-most circuit layer of the carrier 100. The power layer 103 includes a first portion 103a, a second portion 103b, and a third portion 103c. The first portion 103a, the second portion 103b, and the third portion 103c are separated from one another. The first portion 103a and the second portion 103b are electrically connected to the pads 107, and may be in direct contact with the pads 107. In some implementations, the third portion 103c is not in direct contact with any of the pads 107. At least one pad of the pads 107 contacts the first portion 103a of the power layer 103. At least another pad of the pads 107 contacts the second portion 103b of the power layer 103. The second portion 103b may be connected to conductive vias in the carrier 100. The first portion 103a, the second portion 103b, and the third portion 103c of the power layer 103 are partially exposed from the insulating layer 108.

The conductive element 104 includes a first portion 104a, a second portion 104b, and a third portion 104c. The first portion 104a of the conductive element 104 is electrically connected to the first portion 103a of the power layer 103. The third portion 104c of the conductive element 104 is electrically connected to the third portion 103c of the power layer 103. The second portion 104b of the conductive element 104 covers substantially all of the electrical component 105. The second portion 104b of the conductive element 104 extends over substantially all of the package body 109 and substantially covers the carrier 100 (e.g. covers substantially all of the carrier 100). This structure of the conductive element 104 can provide for enhanced thermal performance of the semiconductor device package 50. Since the first portion 104a and the third portion 104c of the conductive element 104 are respectively disposed on the first portion 103a and the third portion 103c of the power layer 103, the structure of the conductive element 104 may have strong mechanical stability and may be capable of bearing significant stress. The conductive element 104, the power layer 103, and the electrical component 105 form a power-transmission path. The first portion 104a and the second portion 104b of the conductive element 104, the first portion 103a of the power layer 103, the electrical component 105, and the pads 107 form a power-transmission path.

Figure 5B:
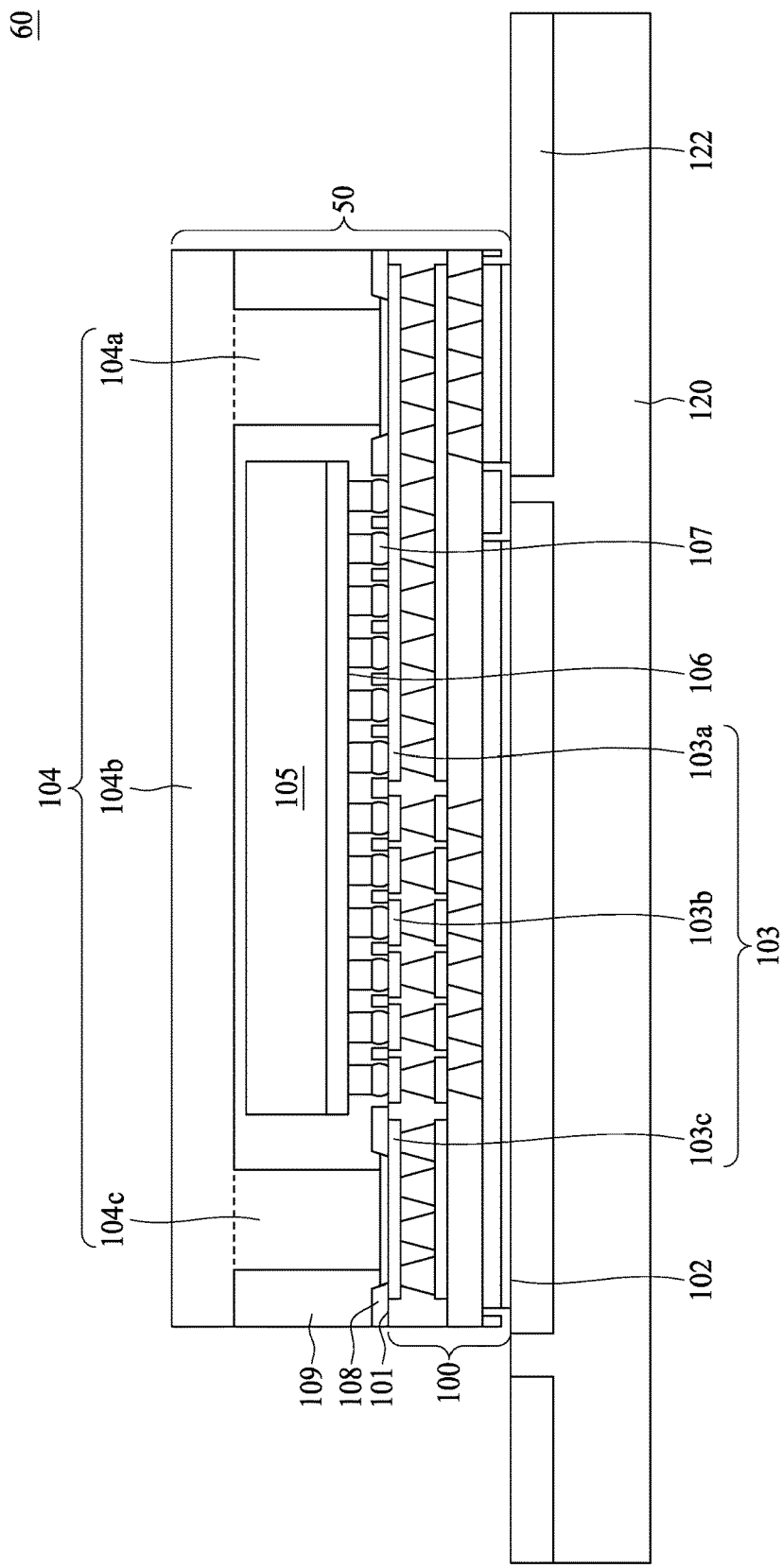
FIG. 5B illustrates a cross-sectional view of some embodiments of a semiconductor device package according to the fourth aspect of the present disclosure.

FIG. 5B is a cross-sectional view of some embodiments of a semiconductor device package 60 in accordance with the fourth aspect of the present disclosure. The semiconductor device package 60 includes the semiconductor device package 50 (as shown in FIG. 5A) and a carrier 120. The carrier 100 of the semiconductor device package 50 is disposed on (e.g. attached to) the carrier 120.

Figure 5C:
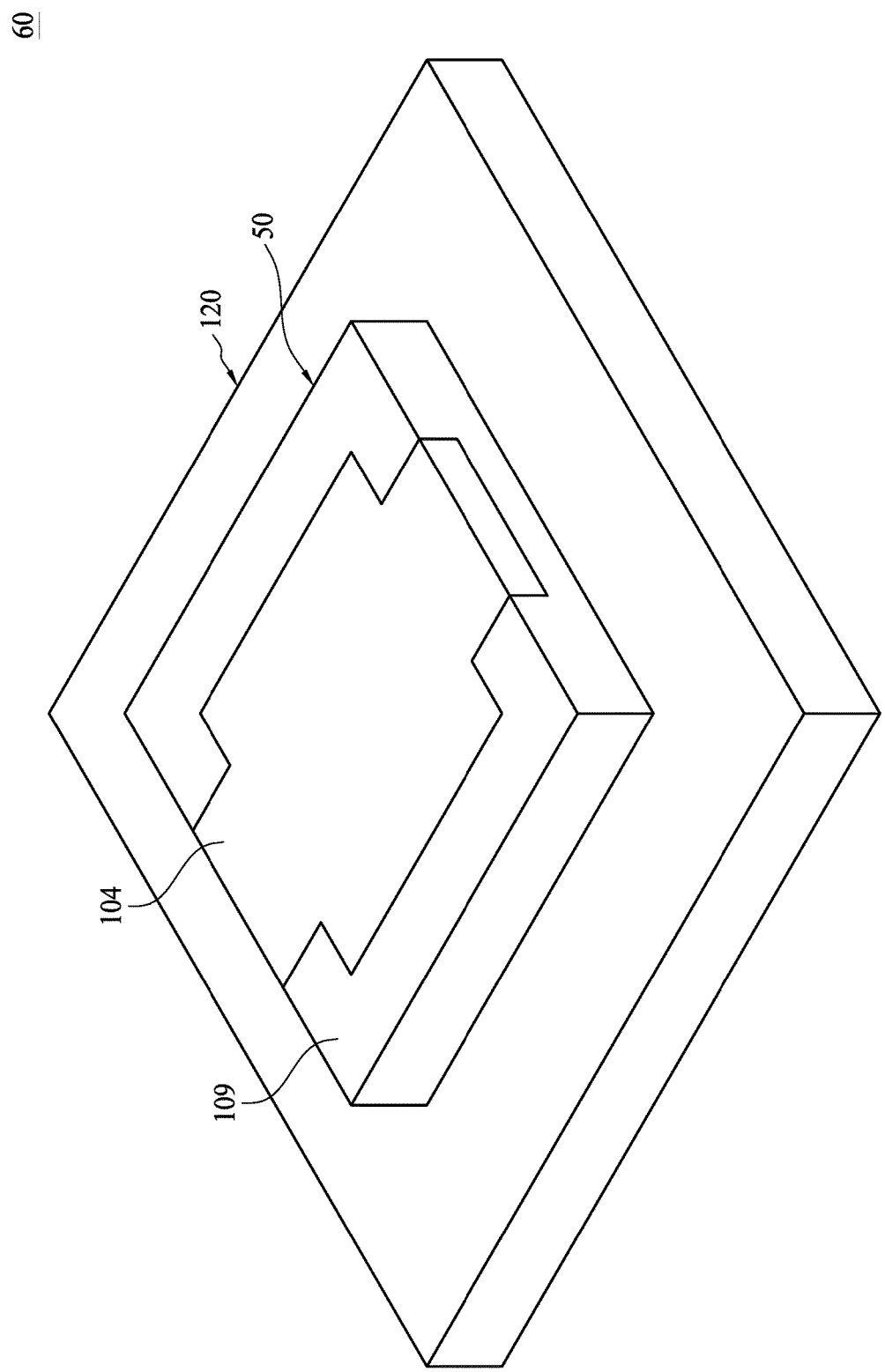
FIG. 5C illustrates a perspective view of some embodiments of a semiconductor device package according to the fourth aspect of the present disclosure.

FIG. 5C is a perspective view of some embodiments of a semiconductor device package 60 in accordance with the fourth aspect of the present disclosure. A top surface of the conductive element 104 is exposed from the package body 109. A surface area of the top surface of the conductive element 104 may be set based on design specifications. The top surface of the conductive element 104 may cover substantially all of the package body 109.

In some embodiments, the semiconductor device package 50 of the semiconductor device package 60 may be protected by an outside housing defining a socket. The semiconductor device package 50 may be substantially completely covered by the outside housing. The semiconductor device package 50 may be electrically connected to the carrier 120 through the socket of the outside housing. The outside housing can be configured to isolate the semiconductor device package 50 from an outside environment and to protect the semiconductor device package 50 from outside contaminations. The outside housing can provide for heat dissipation such that heat generated in the semiconductor device package 50 can spread to air through the outside housing.

Figure 6A:
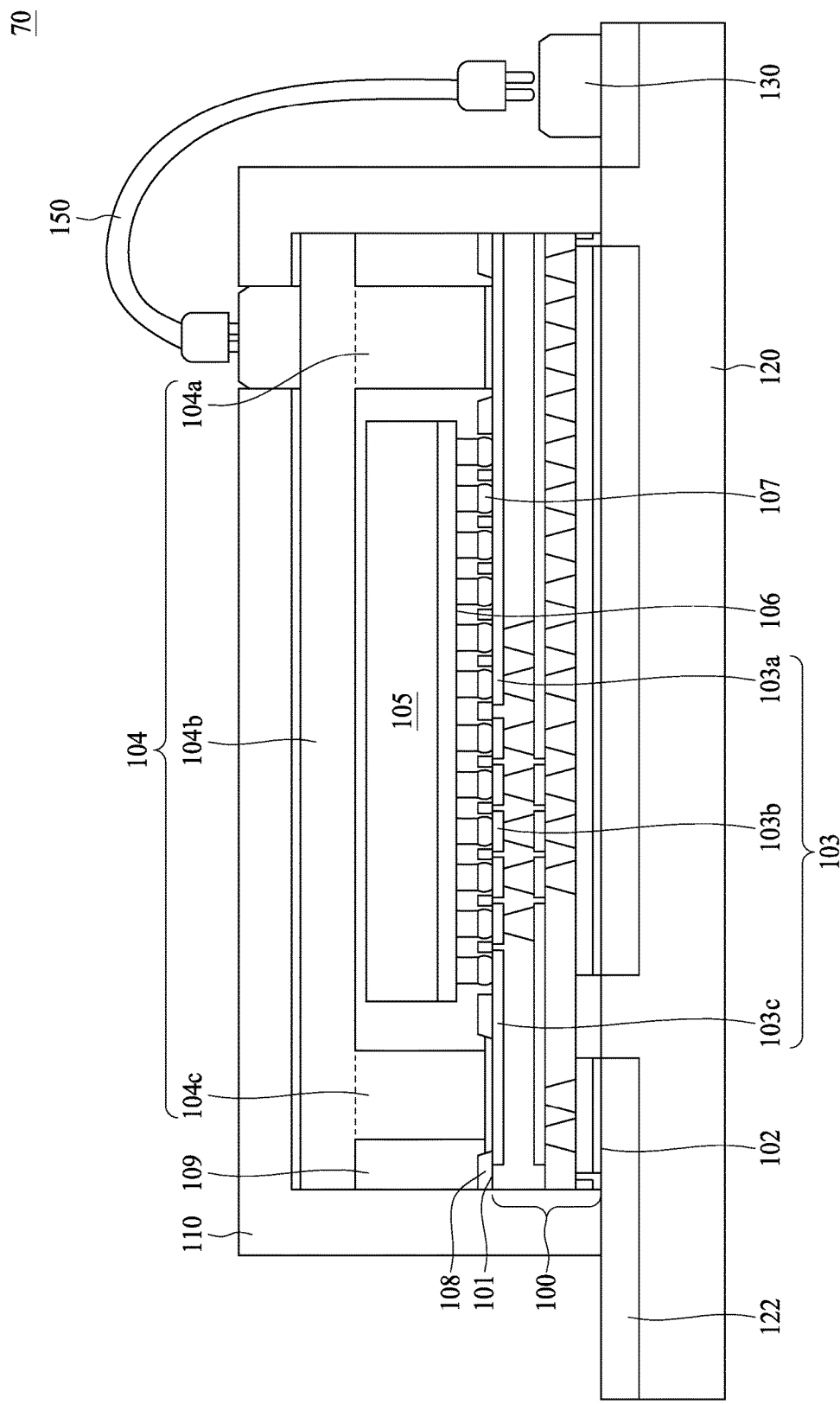
FIG. 6A illustrates a cross-sectional view of some embodiments of a semiconductor device package according to a fifth aspect of the present disclosure.

FIG. 6A is a cross-sectional view of some embodiments of a semiconductor device package 70 according to a fifth aspect of the present disclosure. The semiconductor device package 70 is similar to the semiconductor device package 60 shown in FIG. 5B, except that a heat spreader 110 is disposed on the conductive element 104 and the connection structure 150 connects the power output 130 to the conductive element 104. The heat spreader 110 can further enhance heat dissipation. The heat spreader 110 defines an opening. A location of the opening corresponds to (e.g. is above) the first portion 104a of the conductive element 104. The connection structure 150 is a socket type. The connection structure 150 has a first terminal and a second terminal. The first terminal of the connection structure 150 is connected to the power output 130. The second terminal of the connection structure 150 is connected to the second portion 104b of the conductive element 104. Power is supplied from the conductive layer 122 of the carrier 120 to a power-transmission path that includes the conductive element 104, the power layer 103, and the electrical component 105. Since most of the power is transmitted through the power-transmission path rather than being transmitted through the interconnection structure in the carrier 100, an overall resistance of the semiconductor device package 70 can be decreased.

In this structure of the semiconductor device package 70, the power supplied from the power output 130 is transmitted from the connection structure 150 to the conductive element 104 and then transmitted to the electrical component 105 through the power layer 103. Since the power need not be transmitted from the carrier 100 to the electrical component 105 through the power layer 103, the power layer 103 need not extend under substantially all of the electrical component 105 (e.g., the power layer 103 may extend under a portion of the electrical component 105). In some embodiments, an area under the electrical component 105 may thus be saved for other circuit components or designs.

Figure 6B:
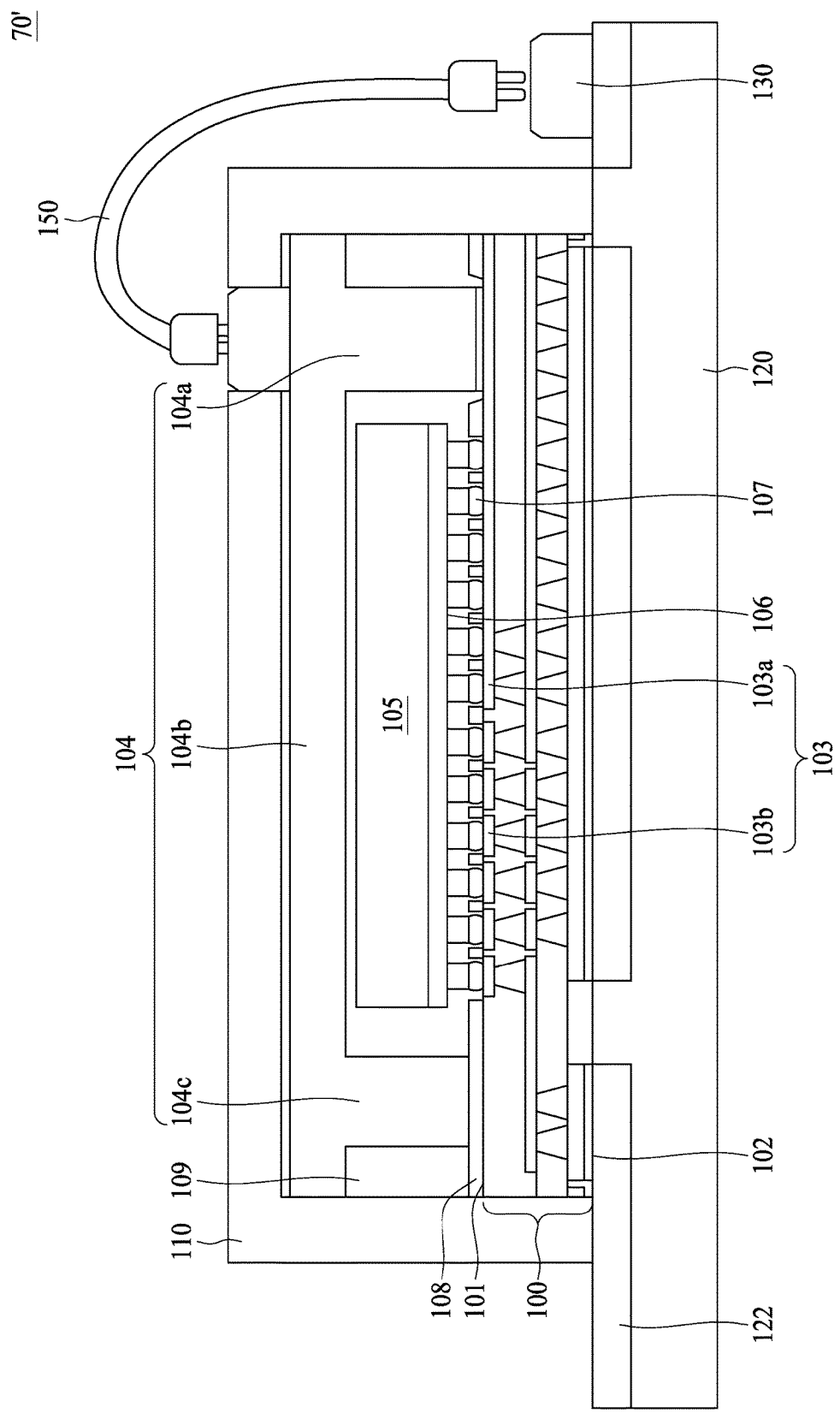
FIG. 6B illustrates a cross-sectional view of some embodiments of a semiconductor device package according to the fifth aspect of the present disclosure.

FIG. 6B is a cross-sectional view of some embodiments of a semiconductor device package 70' according to the fifth aspect of the present disclosure. The semiconductor device package 70' is similar to the semiconductor device package 70 shown in FIG. 6A, except that the power layer 103 does not include the third portion 103c, and the third portion 104c of the conductive element 104 is disposed on the insulation layer 108. The semiconductor device package 70' can provide for a configuration in which substantially no current flows to the electrical component 105 through the third portion 104c of the conductive element 104. This structure can provide for flexibility in a layout of the semiconductor device package 70'.

Figure 6C:
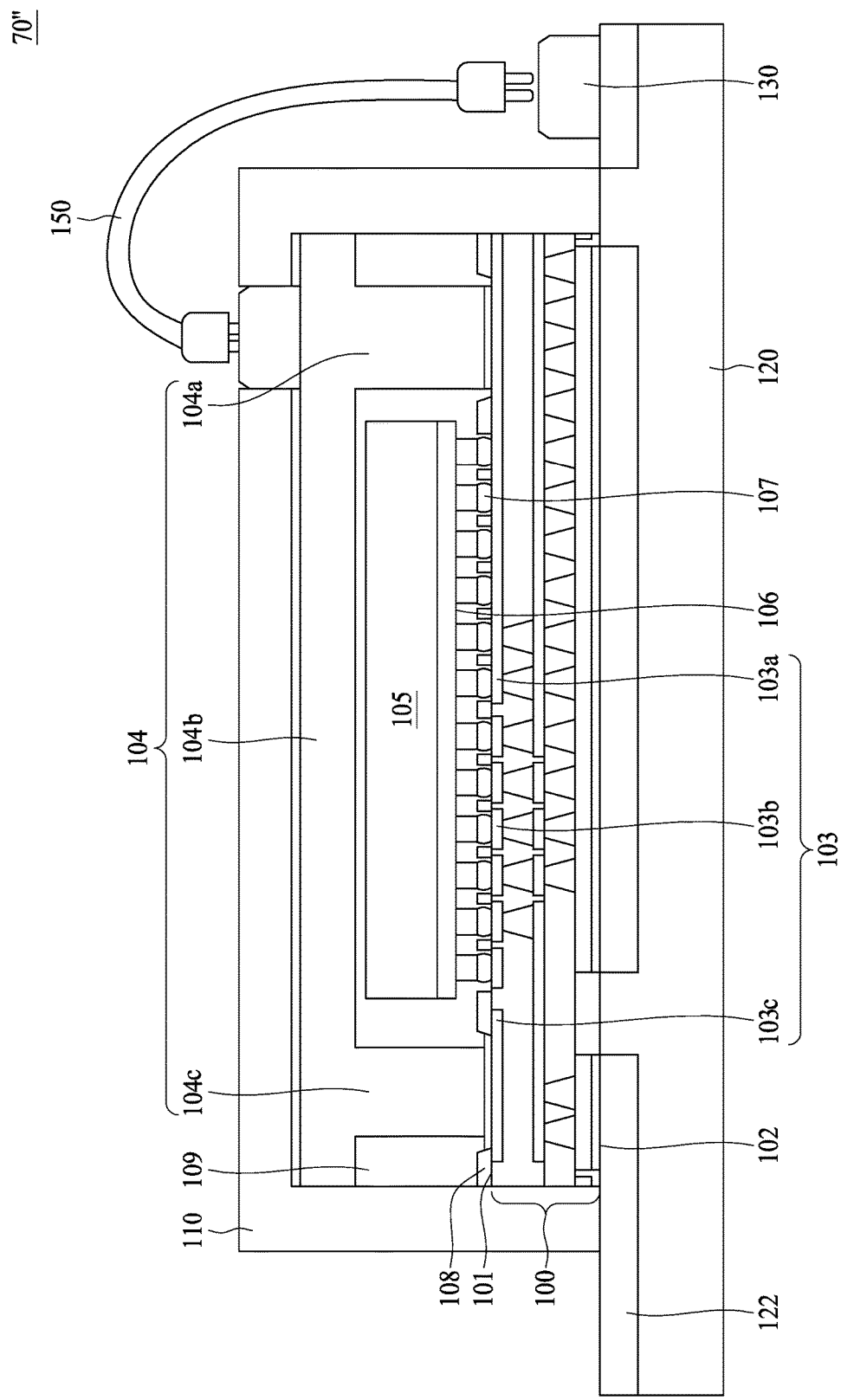
FIG. 6C illustrates a cross-sectional view of some embodiments of a semiconductor device package according to the fifth aspect of the present disclosure.

FIG. 6C is a cross-sectional view of some embodiments of a semiconductor device package 70" according to the fifth aspect of the present disclosure. The semiconductor device package 70" is similar to the semiconductor device package 70 shown in FIG. 6A, except that the third portion 103c of the power layer 103 is not electrically connected to the electrical component 105. This structure can provide for flexibility in a layout of the semiconductor device package 70".

FIG. 7A, FIG. 7B, FIG. 7C, FIG. 7D, FIG. 7E, FIG. 7F, FIG. 7G, and FIG. 7H illustrate embodiments of a method of manufacturing a semiconductor device package according to the fifth aspect of the present disclosure.

Figure 7A:
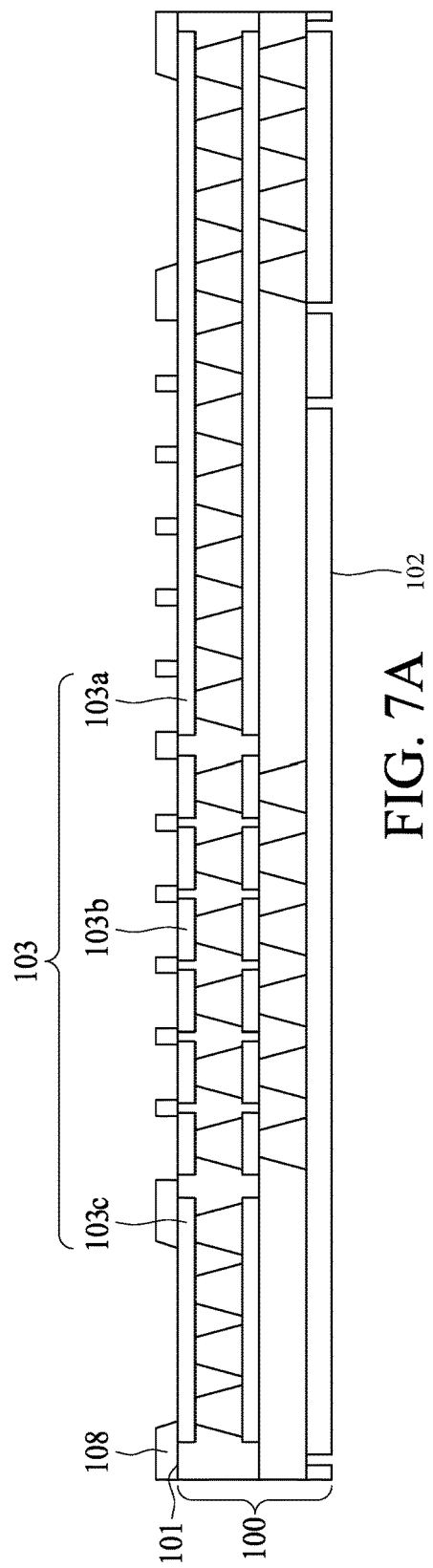
FIG. 7A illustrates some embodiments of a method of manufacturing a semiconductor device package according to some embodiments of the present disclosure.

Referring to FIG. 7A, a method for manufacturing a semiconductor device package includes providing the carrier 100. The carrier 100 has a front side (e.g. the top surface 101) and a back side (e.g. the bottom surface 102). The carrier 100 includes the power layer 103 with the first portion 103a, the second portion 103b, and the third portion 103c. The insulation layer 108 is disposed on the top surface 101 of the carrier 100. The insulation layer 108 is patterned to expose part of the power layer 103.

Figure 7B:
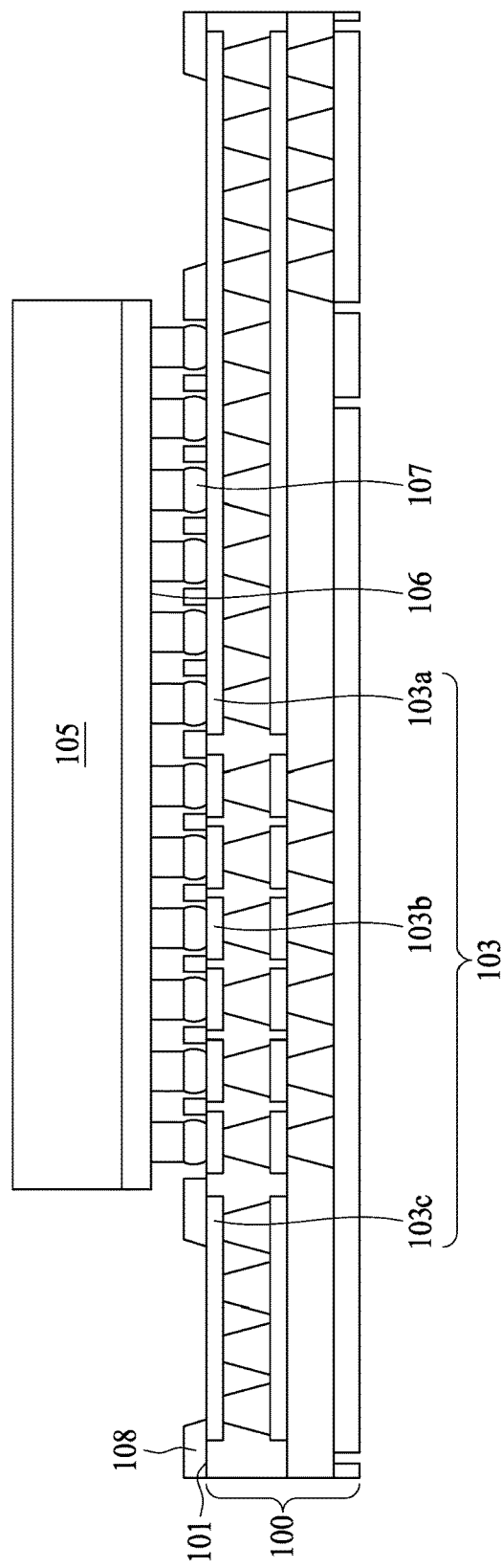
FIG. 7B illustrates some embodiments of a method of manufacturing a semiconductor device package according to some embodiments of the present disclosure.

Referring to FIG. 7B, the electrical component 105 is flipped and disposed on the first portion 103a and the second portion 103b of the power layer 103 through the pads 107. The active surface of the electrical component 105 faces the top surface 101 of the carrier 100. In some embodiments, the electrical component 105 may be disposed on the first portion 103a, the second portion 103b, and the third portion 103c of the power layer 103 through the pads 107.

Figure 7C:
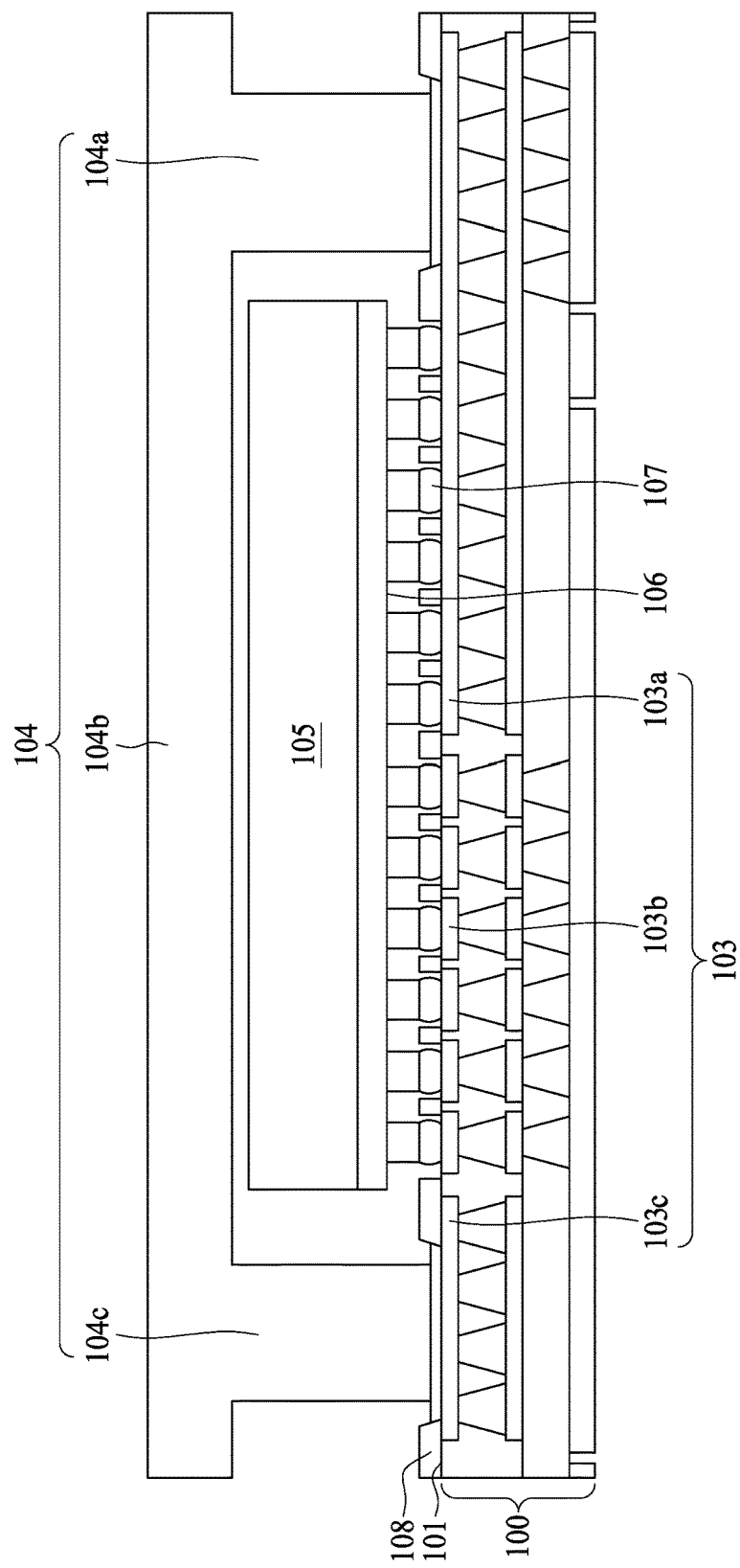
FIG. 7C illustrates some embodiments of a method of manufacturing a semiconductor device package according to some embodiments of the present disclosure.

Referring to FIG. 7C, the conductive element 104 is disposed on the top surface 101 of the carrier 100. The first portion 104a of the conductive element 104 is electrically connected to the first portion 103a of the power layer 103. The third portion 104c of the conductive element 104 is electrically connected to the third portion 103c of the power layer 103.

Figure 7D:
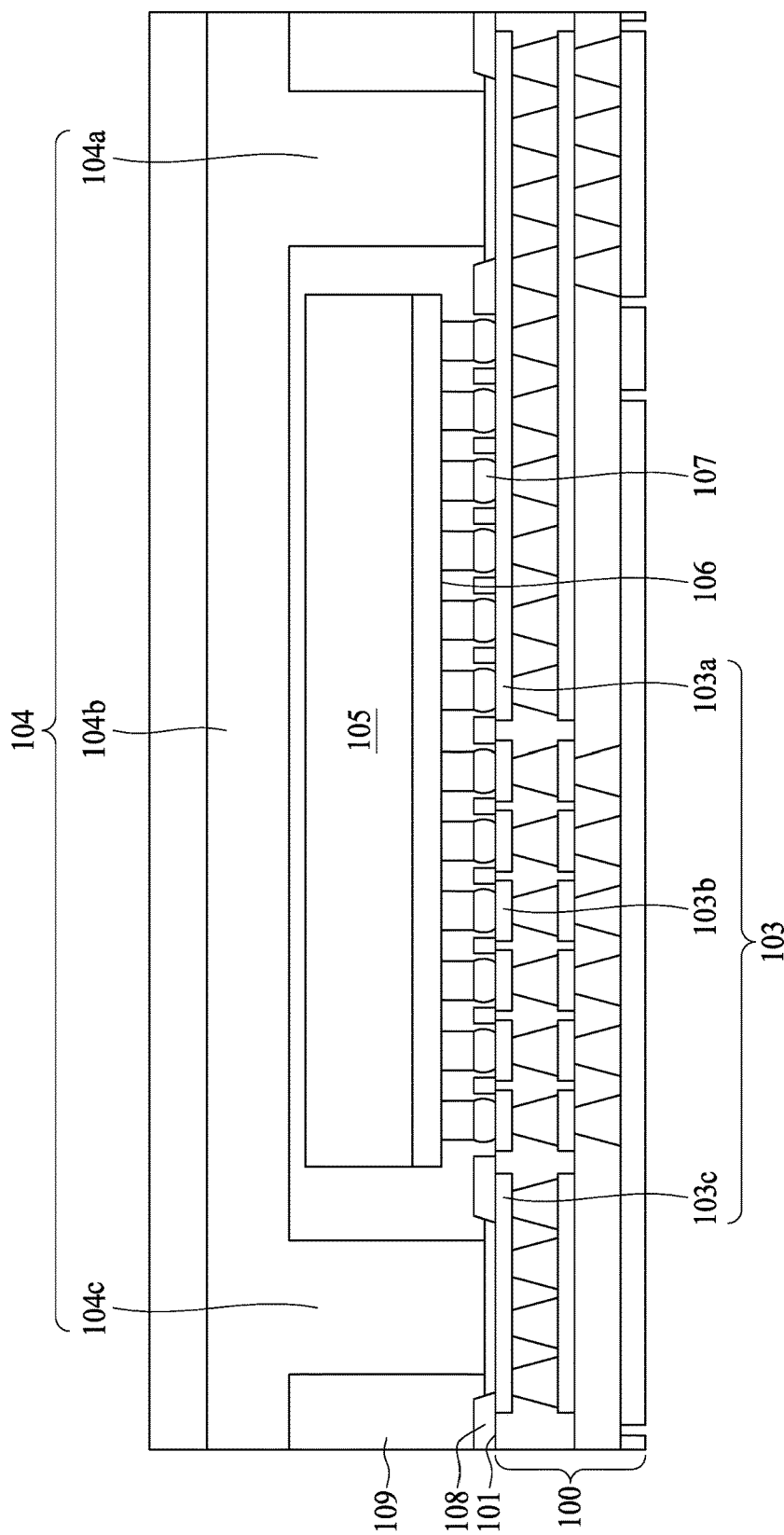
FIG. 7D illustrates some embodiments of a method of manufacturing a semiconductor device package according to some embodiments of the present disclosure.

Referring to FIG. 7D, the package body 109 is molded on the top surface 101 of the carrier 100. The package body 109 encapsulates at least a portion of the first surface 101 of the carrier 100, the conductive element 104, the electrical component 105, and the insulation layer 108.

Figure 7E:
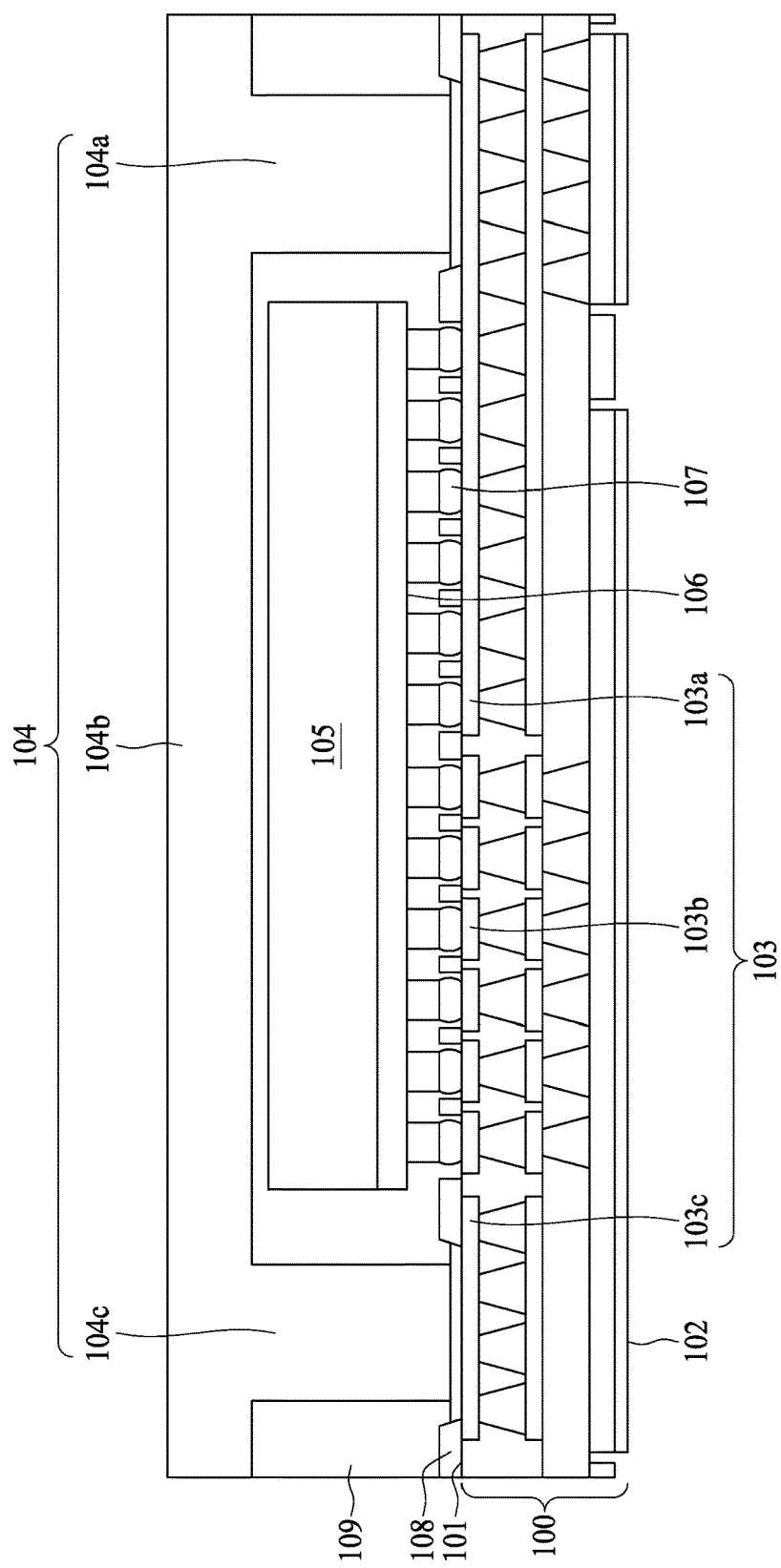
FIG. 7E illustrates some embodiments of a method of manufacturing a semiconductor device package according to some embodiments of the present disclosure.

Referring to FIG. 7E, the package body 109 is ground (or otherwise partially removed) so as to expose the top surface of the second portion 104b of the conductive element 104.

Figure 7F:
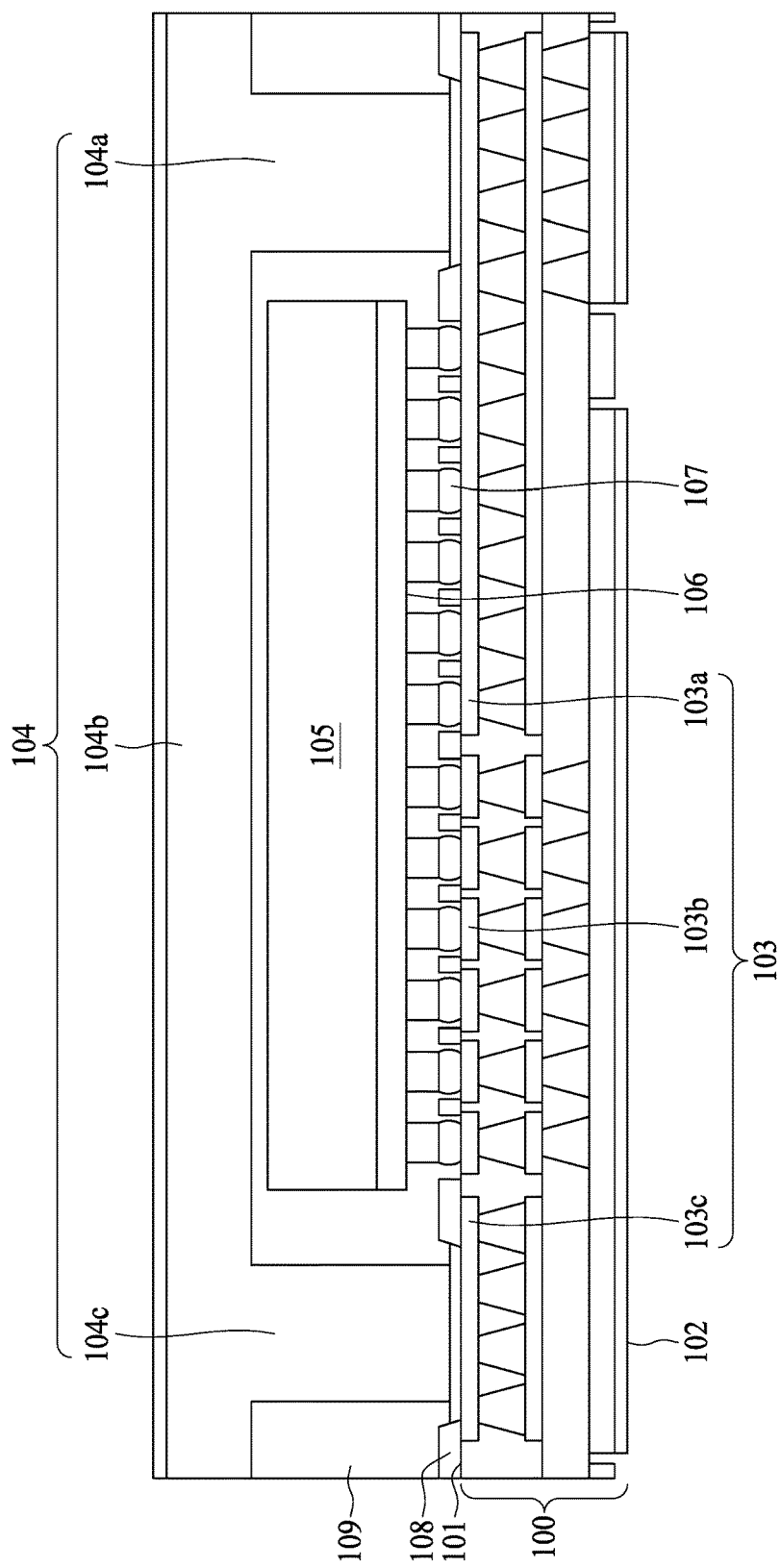
FIG. 7F illustrates some embodiments of a method of manufacturing a semiconductor device package according to some embodiments of the present disclosure.

Referring to FIG. 7F, a conductive layer (e.g. a thermal conductive layer) is plated on the second portion 104b of the conductive element 104. The conductive layer may include tin (Sn) and/or other suitable conductive materials. In some embodiments, a second conductive layer (e.g. a thermal conductive layer) may be plated on the bottom surface 102 of the carrier 100. The second conductive layer may include the same or similar material as that of the conductive layer.

Figure 7G:
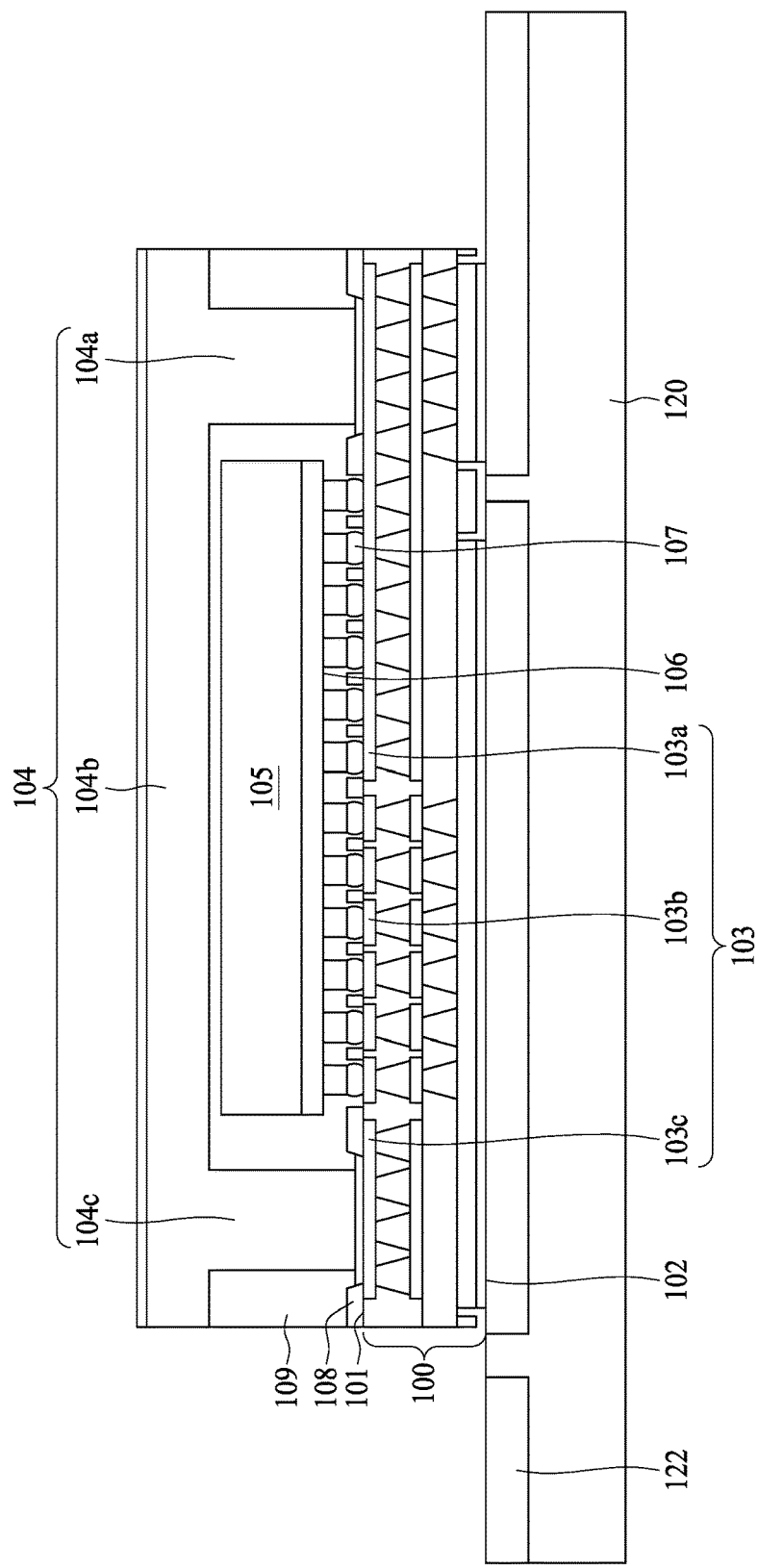
FIG. 7G illustrates some embodiments of a method of manufacturing a semiconductor device package according to some embodiments of the present disclosure.

Referring to FIG. 7G, the carrier 100 is disposed on (e.g. attached to) a carrier 120.

Figure 7H:
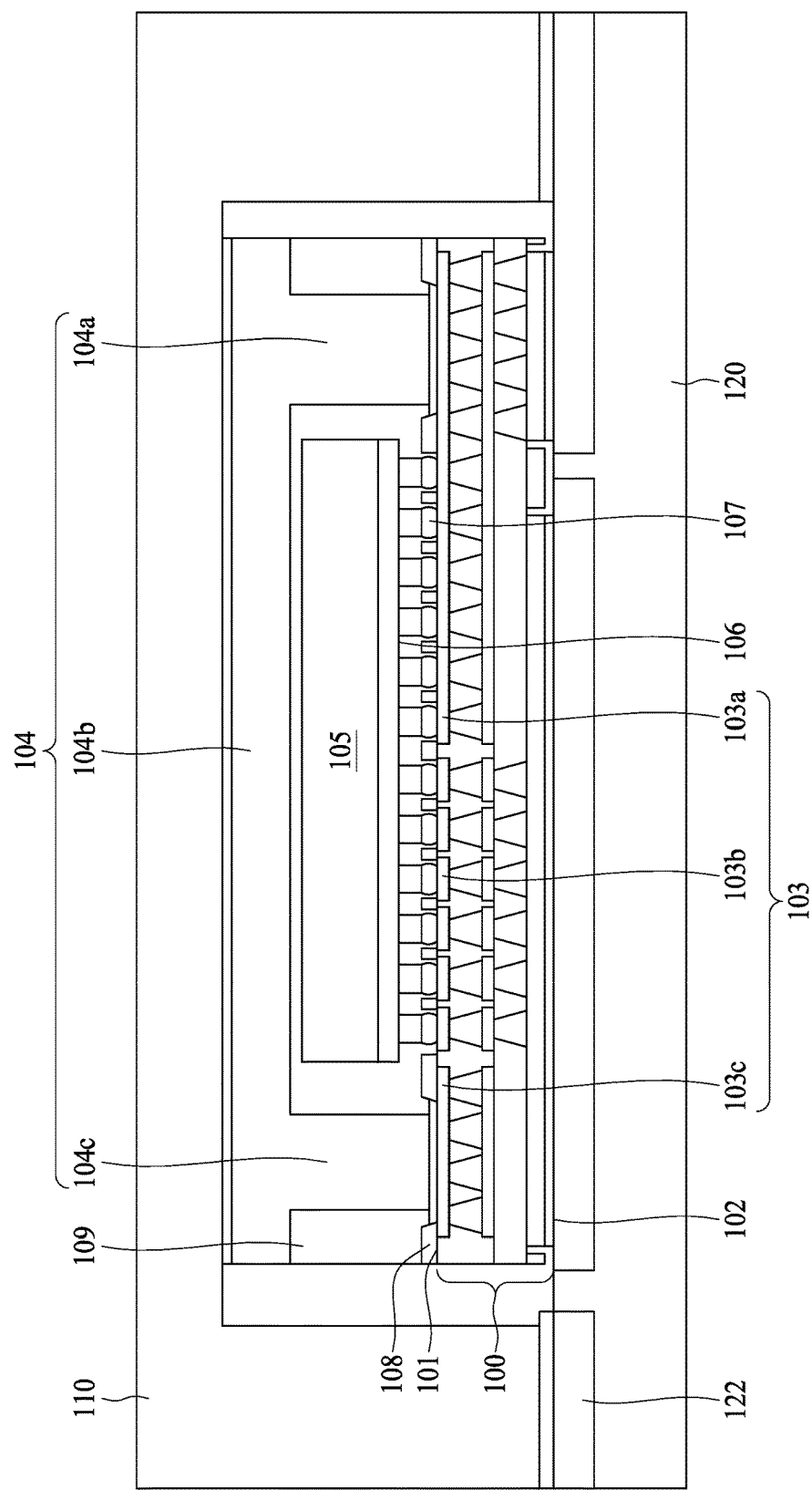
FIG. 7H illustrates some embodiments of a method of manufacturing a semiconductor device package according to some embodiments of the present disclosure.

Referring to FIG. 7H, a heat spreader 110 is disposed on the conductive element 104 and the carrier 120. The heat spreader 110 is connected to the conductive element 104 and the conductive layer 122. The heat spreader 110 extends over the second portion 104b of the conductive element 104 and over the electrical component 105. There are spaces between the heat spreader 110 and the lateral sides of the package body 109, which can provide for increased heat dissipation. In some embodiments, the heat spreader 110 can cover substantially all of, and contact the lateral sides of, the package body 109. In some embodiments, the heat spreader 110 may define an opening. A position of the opening may correspond to (e.g. may be above at least a portion of) the first portion 104a of the conductive element 104 such that at least one connection structure (e.g. the connection structure 150 shown in FIG. 6A) may connect the conductive element 104 to an power output on the carrier 120.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
a first carrier including a power output;
a second carrier disposed on the first carrier and having a first surface and including a power layer adjacent to the first surface of the second carrier;
an electrical component disposed on the first surface of the second carrier and electrically connected to the power layer;
a conductive element disposed on the first surface of the second carrier and electrically connected to the power layer; and
a connection structure including a first terminal and a second terminal, wherein the first terminal of the connection structure is connected to the power output and the second terminal of the connection structure is connected to the conductive element.

2. The semiconductor device package claim 1, wherein the power layer includes a first portion and a second portion separated from the first portion.

3. The semiconductor device package claim 2, wherein the electrical component has an active surface and includes a plurality of pads disposed on the active surface, and wherein a first pad of the plurality of pads contacts the first portion of the power layer and a second pad of the plurality of pads contacts the second portion of the power layer.

4. The semiconductor device package of claim 2, wherein the conductive element includes a first portion, a second portion, and a third portion, and wherein the first portion of the conductive element contacts the first portion of the power layer and the second portion of the conductive element contacts the second portion of the power layer.

5. The semiconductor device package of claim 4, further comprising a package body encapsulating the first surface of the second carrier, the conductive element, and the electrical component, wherein the third portion of the conductive element is exposed from the package body.

6. The semiconductor device package of claim 5, further comprising a heat spreader disposed on the package body and connected to the conductive element.

7. The semiconductor device package of claim 2, further comprising an insulating layer disposed on the first surface of the second carrier,
wherein the first portion of the power layer is partially exposed from the insulating layer,
wherein the conductive element includes a first portion, a second portion extending over the electrical component, and a third portion, and wherein the first portion of the conductive element contacts the first portion of the power layer and the third portion of the conductive element contacts the insulating layer.

8. The semiconductor device package claim 1, wherein the conductive element includes an extension portion extending over the electrical component.

9. The semiconductor device package of claim 1, further comprising a package body encapsulating the first surface of the second carrier, the conductive element, and the electrical component, wherein at least one surface of the conductive element is exposed from the package body.

10. The semiconductor device package of claim 9, further comprising a heat spreader disposed on the package body and connected to the conductive element.

* * * * *